(12) United States Patent
Fujimori et al.

(10) Patent No.: US 6,897,142 B2
(45) Date of Patent: May 24, 2005

(54) FORMATION OF SOLDER BALLS HAVING RESIN MEMBER AS REINFORCEMENT

(75) Inventors: Joji Fujimori, Kawasaki (JP); Ichiro Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/631,756

(22) Filed: Aug. 1, 2003

(65) Prior Publication Data

US 2004/0046252 A1 Mar. 11, 2004

(30) Foreign Application Priority Data

Sep. 11, 2002 (JP) .................................... 2002-265432

(51) Int. Cl.$^7$ ................................................ H01L 21/60
(52) U.S. Cl. ............................. 438/615; 257/E23.021
(58) Field of Search ............................... 438/612, 613, 438/615, 958; 257/738, E23.018, E23.021

(56) References Cited

U.S. PATENT DOCUMENTS

| | | | | |
|---|---|---|---|---|
| 5,088,189 | A | * | 2/1992 | Brown ........................ 29/840 |
| 6,028,011 | A | * | 2/2000 | Takase et al. ............... 438/745 |
| 2001/0008310 | A1 | * | 7/2001 | Sakuyama et al. .......... 257/737 |
| 2002/0195170 | A1 | * | 12/2002 | Nomura et al. .............. 148/23 |

FOREIGN PATENT DOCUMENTS

| | | | | |
|---|---|---|---|---|
| EP | 869704 A1 | * | 10/1998 | ............ H05K/3/34 |
| JP | 08174264 A | * | 7/1996 | ........... B23K/35/22 |
| JP | 09172035 A | | 6/1997 | |
| JP | 11320176 A | * | 11/1999 | ........... B23K/35/22 |
| JP | 2001007158 A | | 1/2001 | |

OTHER PUBLICATIONS

Hirobumi Nakamura, "Solder Paste," Japan Patent Office, Sep. 1996, English translation of JP 08–174264 A.*
S. Sakuyama et al., "Solder Paste," Japan Patent Office, Nov. 1999, English translation of JP 11–320176 A.*
URL: Fujitsu Co., Ltd., "Fujitsu Develops Advanced Printing Bump Technology," [online], Dec. 12, 2001, InternetURL:http//pr.fujitsu.com/jp/news/2001/12/12–1.html.
S. Sakuyama, et al., "Solder Bumping Technology for Wafer–scale Packaging", 7$^{th}$ Symposium on "Microjoining and Assembly Technology in Electronics", Micro–Contact Research Committee, Feb. 1, 2001, p. 285–290, (English Abstract).

* cited by examiner

Primary Examiner—Stephen W. Smoot
(74) Attorney, Agent, or Firm—Westerman, Hattori, Daniels & Adrian, LLP

(57) ABSTRACT

A method of forming a solder ball includes the steps of forming an electrode pad on a substrate, forming an insulating layer having a first opening at a position of the electrode pad, filling the first opening with solder paste that include solder and first resin, and applying a heating process to the solder paste so as to form a solder ball on the electrode pad and to form a cured resin member of the first resin across a border between the electrode pad and the substrate.

12 Claims, 26 Drawing Sheets

FORMATION OF SOLDER BALLS HAVING RESIN MEMBER AS REINFORCEMENT

BACKGROUND OF THE INVENTION

1. Field of the Invention

The present invention generally relates to a method of forming a semiconductor chip, solder balls, and an assembly structure.

2. Description of the Related Art

In respect of flip-chip assembly having a semiconductor chip mounted on a circuit board with its face down, an underfill technology is generally known that fills resin material between the semiconductor chip and the circuit board (see patent document 1, for example). When lead-free solder balls of large size are formed on a semiconductor chip, a photosensitive dry film resist may be used (see non-patent document 1, for example). Further, there is a technology that forms a large-scale solder ball free of lead by use of a resist mask (see non-patent document 2, for example).

Patent Document 1:

Japanese Patent Application Publication No. 9-172035

Non-Patent Document 1:

URL: Fujitsu Co., Ltd., "Forming Lead-Free Fine Solder Bumps at Half a Cost, [online], Dec. 12, 2001, [Searched on Sep. 3, 2002], Internet<URL:http://pr.fujitsu.com/jp/news/2001/12/1 2-1.html>

Non-Patent Document 2:

S. Sakuyama, et al., "Technology for Forming of Batch of Bumps on Semiconductor Wafer", 7$^{th}$ Symposium Mate2001, Micro-Contact Research Committee, Feb. 1, 2001, p. 285–290

The underfill technology fills a gap between a semiconductor chip and a circuit board with thermosetting resin such as epoxy resin after the semiconductor chip and the circuit board are connected together by a flip-chip assembly technology. Heat is then applied to cure the thermosetting resin.

With the cured thermosetting resin filling the gap between the semiconductor chip and the circuit board, heat-induced deformation is reduced between the semiconductor chip and the circuit board. This improves the reliability of connections. Since the gap between the semiconductor chip and the circuit board is sealed by the thermosetting resin, corrosion can be prevented by keeping moisture away from solder balls, electrodes, etc.

FIG. 1 is an illustrative drawing showing a cross-sectional view of a semiconductor chip 10 and a circuit board 20 with a thermosetting resin 31 (underfill resin) provided between them by use of a related-art underfill technology. In this example, the semiconductor chip 10 having solder balls 22 formed on electrode pads 11 is mounted in the flip chip configuration on a wiring layer 21 of the circuit board 20 before filing the gap between the semiconductor chip 10 and the circuit board 20 with the thermosetting resin 31.

The thermosetting resin 31 is injected from the position shown by an arrow A into the gap formed between the semiconductor chip 10 and the circuit board 20. Heat is then applied to cure the thermosetting resin 31. With the provision of the thermosetting resin 31, heat-induced deformation between the semiconductor chip 10 and the circuit board 20 can be reduced, thereby improving the reliability of connections at the solder balls 22.

In the method of forming the thermosetting resin 31 as described above, the thermosetting resin 31 needs to be injected into a narrow gap that is formed between the semiconductor chip 10 and the circuit board 20 after the semiconductor chip 10 is mounted in the flip-chip configuration onto the circuit board 20. Filling every corner of the narrow gap with the thermosetting resin 31 is difficult, which may create areas (voids 41) where the thermosetting resin 31 is absent as shown in FIG. 1.

If a heating process for curing the thermosetting resin 31 is performed with these voids being in existence, moisture trapped inside the voids 41 expands due to heat, creating cracks in the thermosetting resin 31 or resulting in severance of the solder balls 22 from the wiring layer 21.

Accordingly, there is a need for a semiconductor chip, a method of forming solder balls, and an assembly structure that offer superior property in terms of the strength of contacts and the reliability of electrical connections of the assembly structure.

SUMMARY OF THE INVENTION

It is a general object of the present invention to provide a semiconductor chip, a method of forming solder balls, and an assembly structure that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor chip, a method of forming solder balls, and an assembly structure particularly pointed out in the specification in such full, clear, concise, and exact terms as to enable a person having ordinary skill in the art to practice the invention.

To achieve these and other advantages in accordance with the purpose of the invention, the invention provides a method of forming a solder ball, including the steps of forming an electrode pad on a substrate, forming an insulating layer having a first opening at a position of the electrode pad, filling the first opening with solder paste that include solder and first resin having an underfill property, and applying a heating process to the solder paste so as to form a solder ball on the electrode pad and to form a cured resin member of said first resin across a border between the electrode pad and the substrate.

According to the method as described above, the first opening is formed in the insulating layer at the position of the electrode pad, and solder paste is provided to fill the first opening. The solder paste that includes solder and the first resin having an underfill property is then heated to form the solder ball on the electrode pad and also to form the cured resin member that supports the solder ball. Since a single heating process suffices to form the solder ball and the cured resin member simultaneously, manufacturing steps are simplified. Further, the cured resin member is placed between the solder ball and the electrode pad, so that it serves to reinforce the strength of connection between the solder ball and the electrode pad.

According to another aspect of the invention, a semiconductor chip includes a substrate, an electrode pad formed on the substrate, an insulating layer having an opening at a position of the electrode pad, a solder ball formed on the electrode pad, and a resin member providing a connection between the solder ball and the substrate so as to support the solder ball.

In the semiconductor chip as described above, the resin member supports the solder ball, thereby serving as reinforcement for connection between the solder ball and the electrode pad.

According to another aspect of the invention, an assembly structure includes a semiconductor chip in which a solder ball is formed on a substrate by the method of forming a solder ball as described above, and a circuit board having at least one wiring layer and having the semiconductor chip mounted thereon, wherein the cured resin member covers part of the solder ball so as to support the solder ball that is placed between the substrate and the circuit board.

In the assembly structure as described above, the cured resin member securely supports the solder ball between the substrate and the circuit board. This reinforces a connection between the electrode pad and the solder ball and a connection between the wiring layer and the solder ball.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

First Embodiment

FIG. 2 through FIG. 5 are drawings showing steps of forming solder balls on a substrate according to a first embodiment of the present invention.

Figure 1:
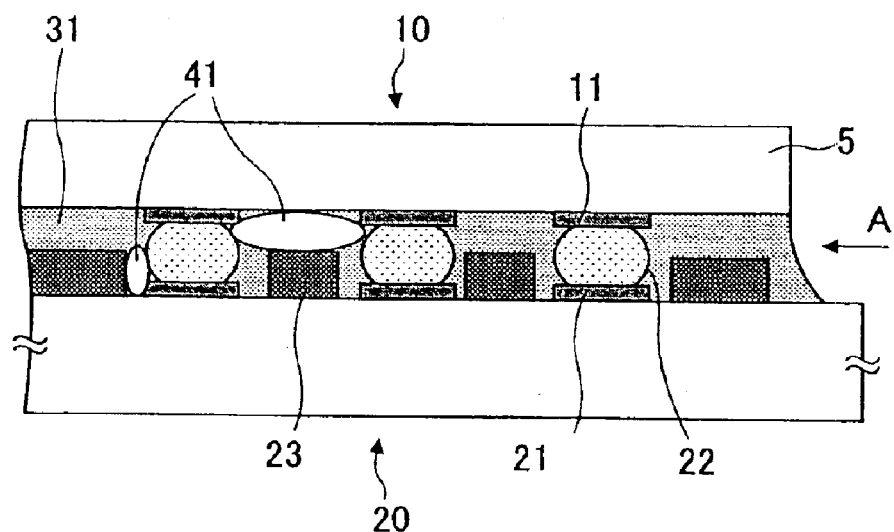
FIG. 1 is a cross-sectional view of a semiconductor chip and a circuit board to which a related-art underfill technology is applied.
Figure 2:
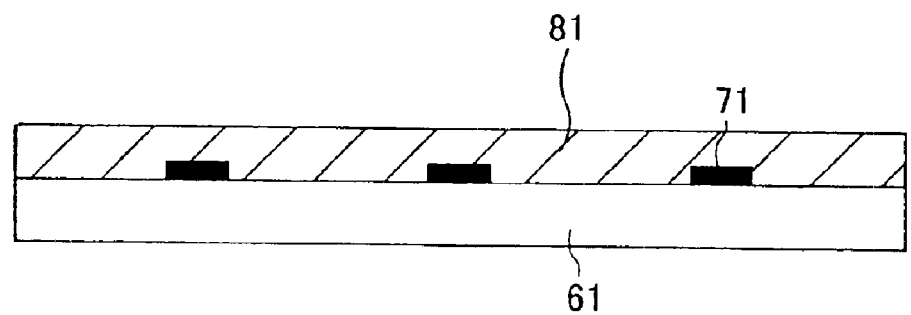
FIG. 2 is an illustrative drawing showing a first step of a method of forming solder balls on a substrate according to a first embodiment of the present invention.

As shown in FIG. 2, electrode pads 71 are patterned on a semiconductor substrate 61 having wiring and insulating layers formed therein. Film-like solder resist 81 is then placed on the electrode pads 71.

Figure 3:
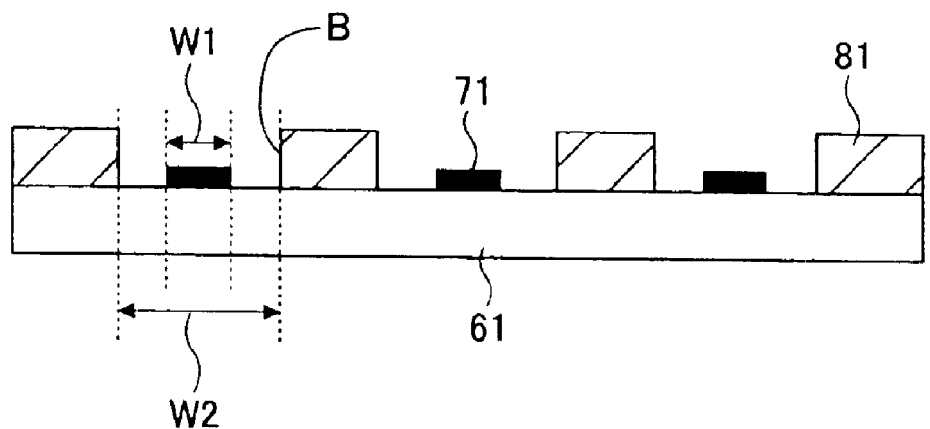
FIG. 3 is an illustrative drawing showing a second step of the method of forming solder balls on the substrate according to the first embodiment of the present invention.

Exposure and developing processes are performed to form openings B in the film-like solder resist 81 on the electrode pads 71 as shown in FIG. 3 where a width W2 is greater than a width W1. The width W2 of the opening B may be about 1.3 to 3.0 times as large as the width W1 of the electrode pad 71, for example.

Figure 4:
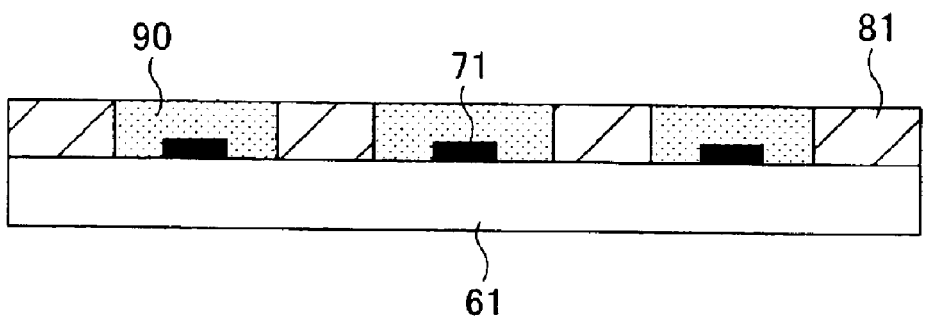
FIG. 4 is an illustrative drawing showing a third step of the method of forming solder balls on the substrate according to the first embodiment of the present invention.

As shown in FIG. 4, solder paste 90, which is a mixture of powder or granular solder and thermosetting resin 171 having an underfilling property, is placed by a squeegee process to fill the openings B. The squeegee process may be performed multiple times to completely fill the openings B with the solder paste 90.

Sn-3% Ag may be used as solder. The openings B preferably have a circular shape, but may be any shape as long as the solder paste 90 can fill the openings B. An epoxy-type resin may be used as the thermosetting resin 171. The ratio of the solder to the thermosetting resin 171 in the solder paste 90 may be adjusted within a range of 70–92 wt % of solder and 8–25 wt % of thermosetting resin 171.

Figure 5:
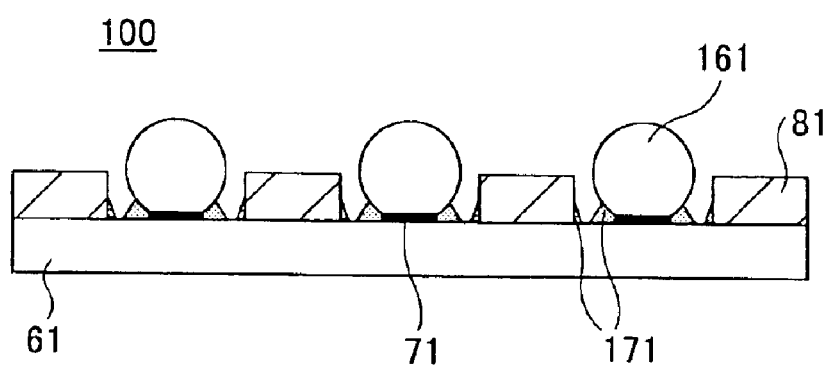
FIG. 5 is an illustrative drawing showing a fourth step of the method of forming solder balls on the substrate according to the first embodiment of the present invention.

A heating process is then performed at temperature T1 that is higher than the melting point T2 of solder of the solder paste 90, and that is also higher than the curing temperature T3 of the thermosetting resin 171. Consequently, as shown in FIG. 5, the thermosetting resin 171 is placed as an underfill between the solder balls 161 and the semiconductor substrate 61 as well as between the sidewalls of the film-like solder resist 81 and the semiconductor substrate 61. Here, the temperature T1 of the heating process may be 240 degrees Celsius.

Figure 6:
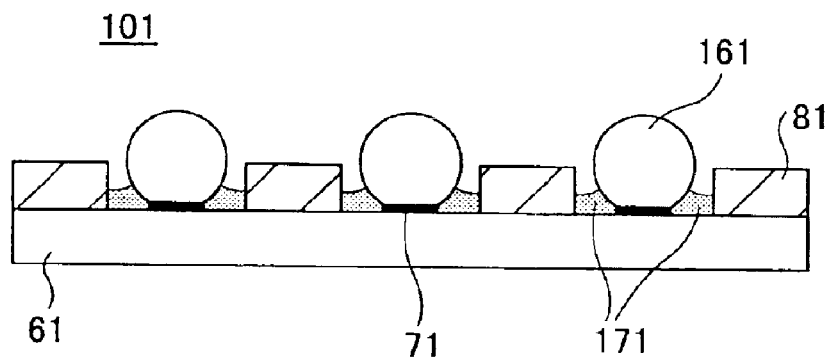
FIG. 6 is a cross-sectional view of a semiconductor chip after a heating process when the proportion of thermosetting resin in the solder paste is relatively high.

FIG. 6 is an illustrative drawing showing a cross-sectional view of the semiconductor chip after the heating process where the proportion of the thermosetting resin in the solder paste is relatively high.

Adjustment of the amount of the thermosetting resin 171 in the solder paste 90 will change the shape of the thermosetting resin 171 formed around solder balls 161 and the film-like solder resist 81. When the proportion of the thermosetting resin 171 is rather high, the thermosetting resin 171 may provide connections between the solder balls 161 and the film-like solder resist 81 as shown in FIG. 6, which adds to the underfill function.

Solder and the thermosetting resin 171 having an underfill function are used together as the solder paste 90 as described above, which provides a basis for forming the solder balls 161 and the thermosetting resin 171 serving as an underfill simultaneously through a single heating process. This simplifies the manufacturing process, and also avoids the generation of cracks in the thermosetting resin 171.

The thermosetting resin 171 provided between the solder balls 161 and the semiconductor substrate 61 can reinforce the connection between the electrode pads 71 and the solder balls 161. Since the thermosetting resin 171 is also provided between the sidewalls of the film-like solder resist 81 and the semiconductor substrate 61, connection can also be reinforced between the film-like solder resist 81 and the semiconductor substrate 61.

Second Embodiment

In the first embodiment, the solder paste 90 is provided to fill the openings B formed in the film-like solder resist 81.

Alternatively, a film-like photo-resist may be placed on the film-like solder resist 81, and two openings are made, which are to be filled by the solder paste 90 to form solder balls.

FIG. 7 through FIG. 11 are illustrative drawings showing the steps of forming solder balls on a substrate according to a second embodiment of the present invention.

Figure 7:
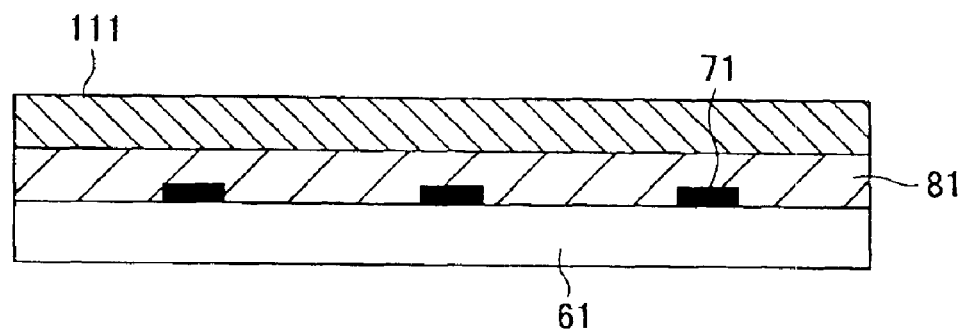
FIG. 7 is an illustrative drawing showing a first step of a method of forming solder balls on a substrate according to a second embodiment of the present invention.

As shown in FIG. 7, the electrode pads 71 are patterned on the semiconductor substrate 61 having wiring and insulating layers formed therein. The film-like solder resist 81 is then placed on the electrode pads 71, followed by placing a film-like photo-resist 111 on the film-like solder resist 81.

Figure 8:
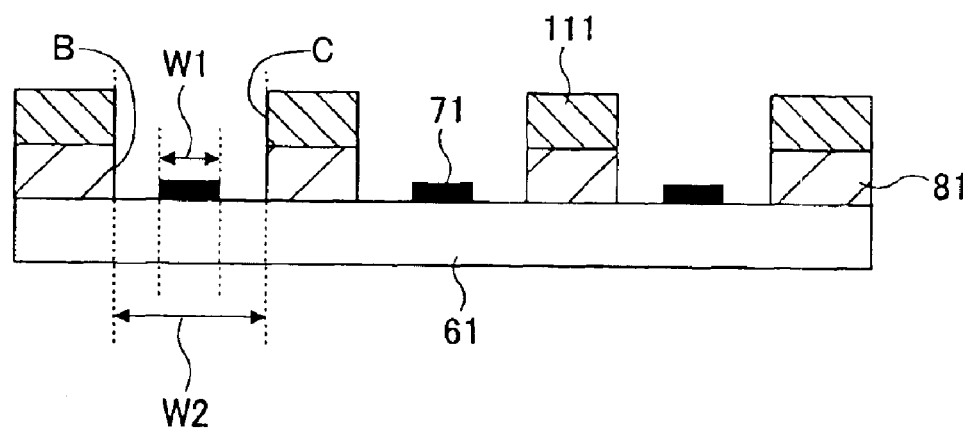
FIG. 8 is an illustrative drawing showing a second step of the method of forming solder balls on the substrate according to the second embodiment of the present invention.

Exposure and developing processes are performed to form the openings B in the film-like solder resist 81 and to form openings C in the film-like photo-resist 111 as shown in FIG. 8 where the width W2 is greater than the width W1. The openings B and the openings C are formed in the same size. The width W2 of the opening B may be about 1.3 to 3.0 times as large as the width W1 of the electrode pad 71, for example.

Figure 9:
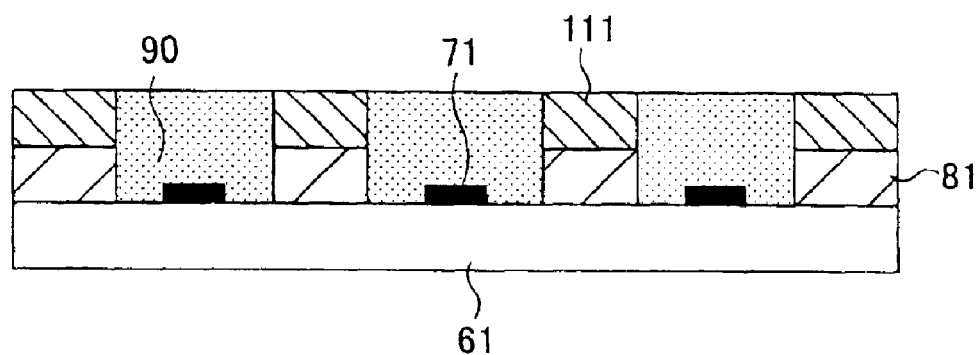
FIG. 9 is an illustrative drawing showing a third step of the method of forming solder balls on the substrate according to the second embodiment of the present invention.

As shown in FIG. 9, the solder paste 90, which is a mixture of solder and the thermosetting resin 171 having an underfilling property, is placed by a squeegee process to fill the openings B and C. The squeegee process may be performed 3 to 8 times to completely fill the openings B and C with the solder paste 90.

Sn-3% Ag may be used as solder. An epoxy-type resin may be used as the thermosetting resin 171. The openings B preferably have a circular shape, but may be any shape as long as the solder paste 90 can fill the openings B.

Figure 10:
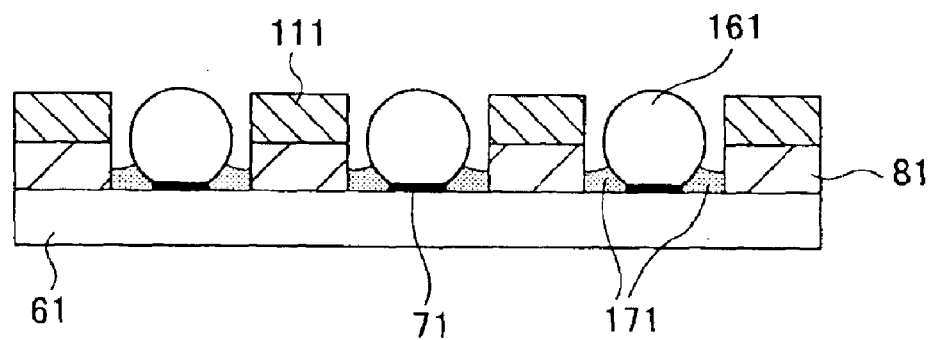
FIG. 10 is an illustrative drawing showing a fourth step of the method of forming solder balls on the substrate according to the second embodiment of the present invention.

A heating process is then performed at the temperature T1 that is higher than the melting point T2 of solder of the solder paste 90, and that is also higher than the curing temperature T3 of the thermosetting resin 171. Consequently, as shown in FIG. 10, the thermosetting resin 171 provides connections between the solder balls 161 and the sidewalls of the film-like solder resist 81.

The temperature T1 of the heating process may be 240 degrees Celsius. When this is done, solder powder that was contained in the solder paste 90 may possibly remain on the surface of the film-like photo-resist 111. If assemblage is performed with the solder powder attached, adhesion with a circuit board may be compromised.

Figure 11:
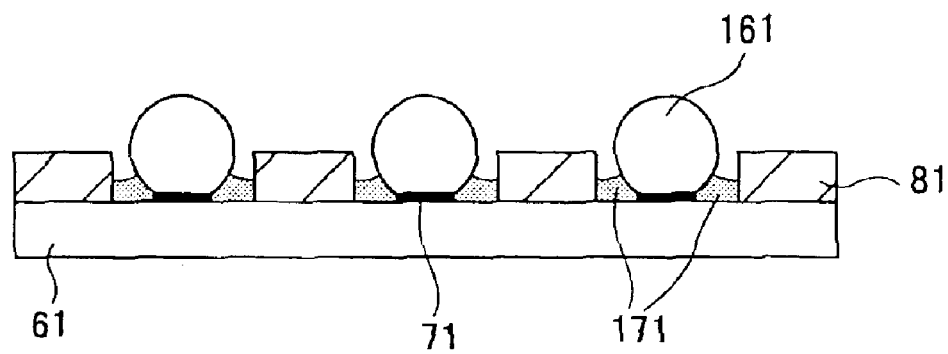
FIG. 11 is an illustrative drawing showing a fifth step of the method of forming solder balls on the substrate according to the second embodiment of the present invention.

As shown in FIG. 11, only the film-like photo-resist 111 is immersed in detachment liquid for the purpose of removing the film-like photoresist 111. When this is done, the solder powder remaining on the surface of the film-like photoresist 111 is also removed.

It should be noted that it suffices to use any other method instead of the method of immersion into the detachment liquid as long as the film-like photo-resist 111 are properly removed. For example, removal by showering of detachment liquid, removal by application of ultrasonic wave to detachment liquid, and removal by use of a detachment-purpose tape are all viable options.

In the manner as described above, the film-like photo-resist 111 is placed on top of the film-like solder resist 81 to form the two openings B and C, thereby allowing an increased amount of the solder paste 90 to fill the openings B and C. As a result, the thermosetting resin 171 provided as an underfill increases in amount between the solder balls 161 and the film-like solder resist 81 on the semiconductor substrate 61. This reinforces connection between the electrode pads 71 and the solder balls 161 and adherence between the film-like solder resist 81 and the semiconductor substrate 61.

The solder balls 161 are formed with increased size. Since the film-like photo-resist 111 is removed after the solder balls 161 are formed, solder powder that was attached to the film-like photo-resist 111 at the time of formation of the solder balls 161 can also be removed. This increases the reliability of connections in a circuit board assembly.

Third Embodiment

In the second embodiment, the openings B and C are formed in the film-like solder resist 81 and the film-like photo-resist 111 before the generation of solder balls. Alternatively, a metal mask may be used in place of the film-like photoresist 111 to form two openings for creation of solder balls.

FIG. 12 through FIG. 15 are illustrative drawings showing the steps of forming solder balls on a substrate according to a third embodiment of the present invention.

Figure 12:
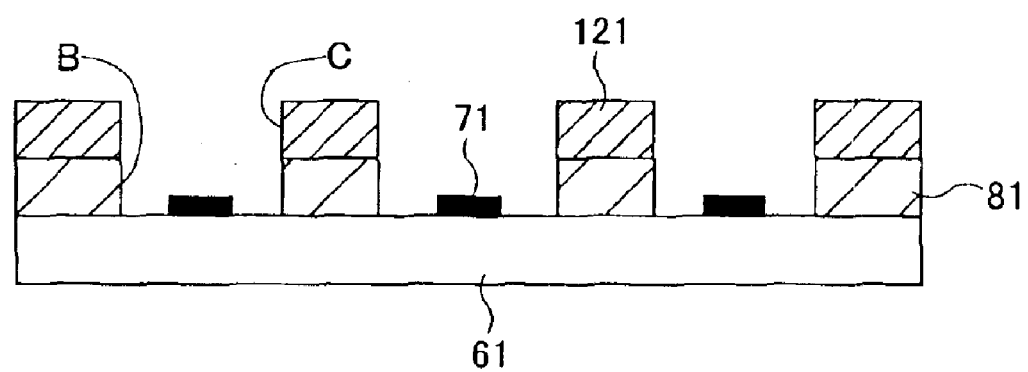
FIG. 12 is an illustrative drawing showing a first step of a method of forming solder balls on a substrate according to a third embodiment of the present invention.

Patterning as shown in FIG. 2 and FIG. 3 are performed first on the semiconductor substrate 61. As shown in FIG. 12, then, a metal mask 121 having openings C the same shape as the openings B is placed on the film-like solder resist 81.

A description has already been given of FIG. 2 and FIG. 3 in connection with the first embodiment, and will not be repeated herein.

Figure 13:
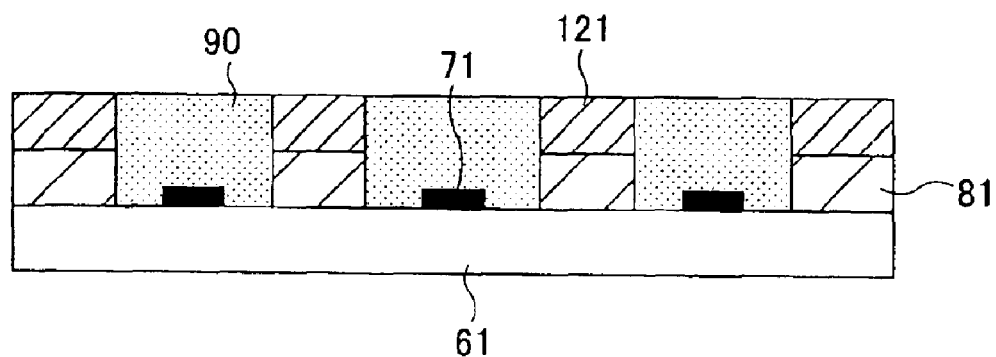
FIG. 13 is an illustrative drawing showing a second step of the method of forming solder balls on the substrate according to the third embodiment of the present invention.

As shown in FIG. 13, the solder paste 90, which is a mixture of solder and the thermosetting resin 171 having an underfilling property, is placed by a squeegee process to fill the openings B and C. Since the squeegee process is carried out on a metal surface, the solder paste 90 slides well, which reduces the number of the squeegee processes necessary for filling the openings B and C with the solder paste 90.

Sn-3% Ag may be used as solder. An epoxy-type resin may be used as the thermosetting resin 171. The openings B preferably have a circular shape, but may be any shape as long as the solder paste 90 can fill the openings B.

Figure 14:
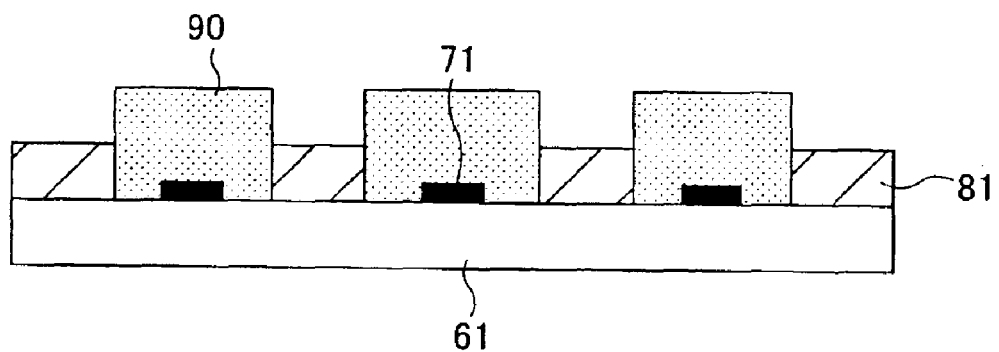
FIG. 14 is an illustrative drawing showing a third step of the method of forming solder balls on the substrate according to the third embodiment of the present invention.
Figure 15:
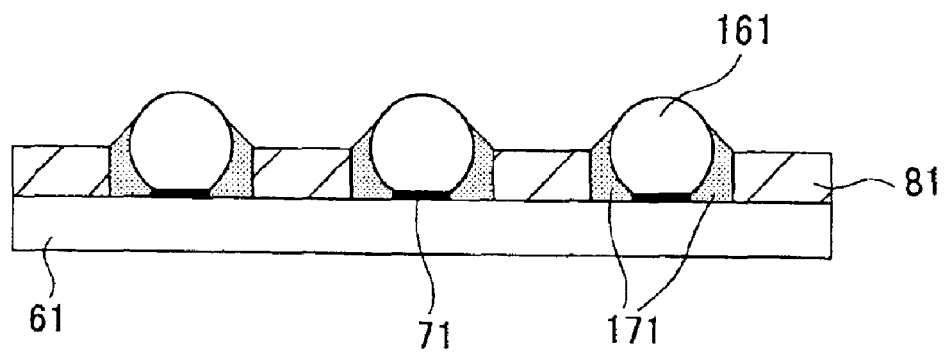
FIG. 15 is an illustrative drawing showing a fourth step of the method of forming solder balls on the substrate according to the third embodiment of the present invention.

As shown in FIG. 14, the metal mask 121 is removed from the film-like solder resist 81. A heating process is then performed at the temperature T1 that is higher than the melting point T2 of solder of the solder paste 90, and that is also higher than the curing temperature T3 of the thermosetting resin 171. Consequently, as shown in FIG. 15, the thermosetting resin 171 provides connections between the solder balls 161 and the sidewalls of the film-like solder resist 81.

In the manner as described above, the metal mask 121 is placed on top of the film-like solder resist 81 to form the two openings B and C, thereby allowing an increased amount of the solder paste 90 to fill the openings B and C. As a result, the thermosetting resin 171 provided as an underfill increases in amount between the solder balls 161 and the film-like solder resist 81 on the semiconductor substrate 61. This reinforces connection between the electrode pads 71 and the solder balls 161 and adherence between the film-like solder resist 81 and the semiconductor substrate 61. Also, the solder balls 161 are reliably formed with desired size.

Since the metal mask 121 is removed prior to the formation of the solder balls 161, solder powder is prevented from sticking to the surface of the film-like solder resist 81. This increases the reliability of connections in a circuit board assembly.

Fourth Embodiment

A fourth embodiment is directed to a variation of the second embodiment in which a film-like photo-resist has openings larger than the openings B formed in the film-like solder resist 81.

FIG. 16 through FIG. 20 are illustrative drawings showing the steps of forming solder balls on a substrate according to the fourth embodiment of the present invention.

Figure 16:
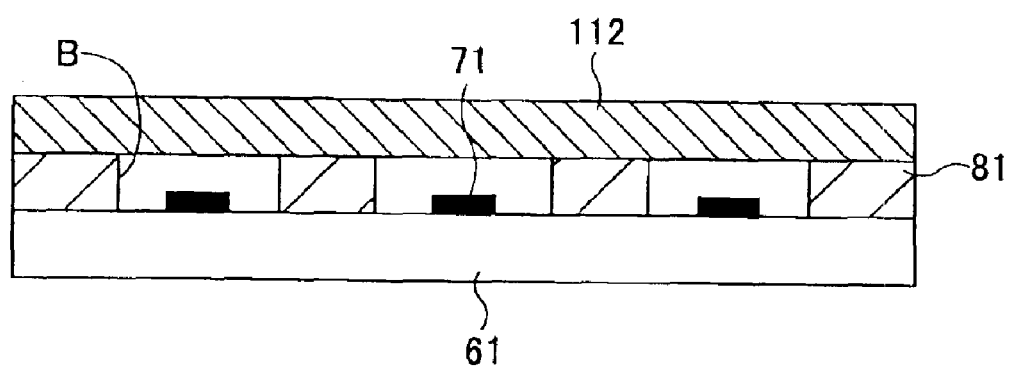
FIG. 16 is an illustrative drawing showing a first step of a method of forming solder balls on a substrate according to a fourth embodiment of the present invention.

First, patterns as shown in FIG. 2 and FIG. 3 are formed on the semiconductor substrate 61. Then, as shown in FIG. 16, a film-like photo-resist 112 is placed on the film-like solder resist 81.

As FIG. 2 and FIG. 3 have already been described in connection with the first embodiment, a further description thereof will be omitted.

Figure 17:
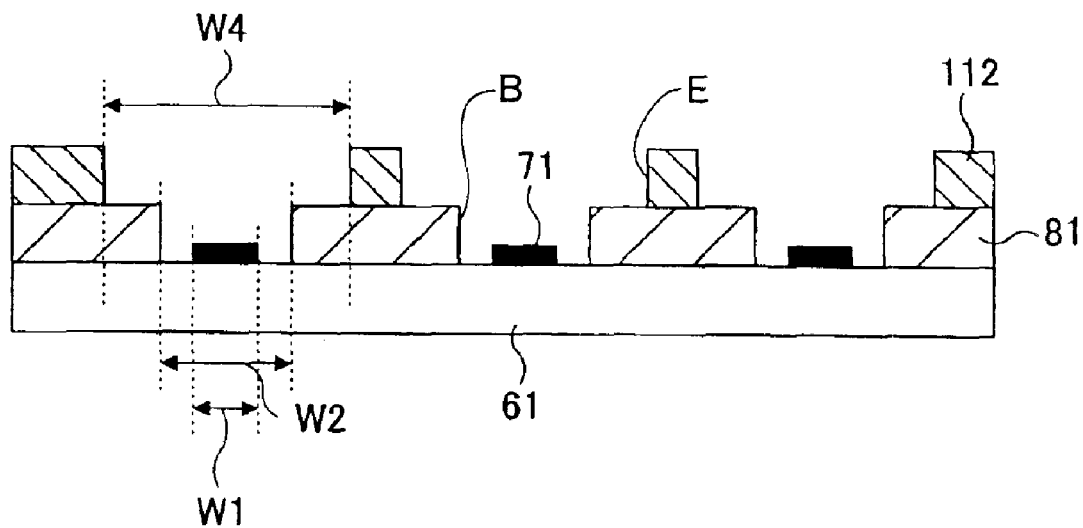
FIG. 17 is an illustrative drawing showing a second step of the method of forming solder balls on the substrate according to the fourth embodiment of the present invention.

As shown in FIG. 17, exposure and developing processes are performed to form openings E in film-like photo-resist 112 such that a width W4>the width W2>the width W1 is satisfied.

Figure 18:
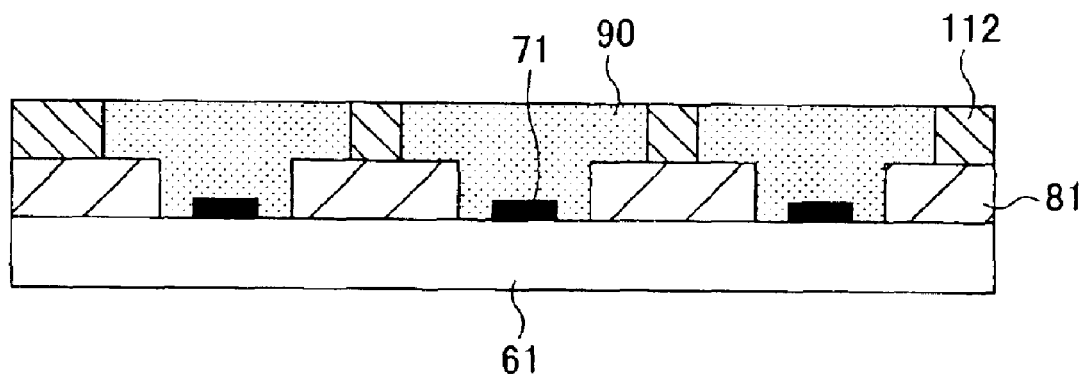
FIG. 18 is an illustrative drawing showing a third step of the method of forming solder balls on the substrate according to the fourth embodiment of the present invention.

As shown in FIG. 18, the solder paste 90, which is a mixture of solder and the thermosetting resin 171 having an underfilling property, is placed by a squeegee process to fill the openings B and E. The squeegee process may be performed 3 to 8 times to completely fill the openings B and E with the solder paste 90. Sn-3% Ag may be used as solder. An epoxy-type resin may be used as the thermosetting resin 171. The openings B and E preferably have a circular shape, but may be any shape as long as the solder paste 90 can fill the openings B and E.

Figure 19:
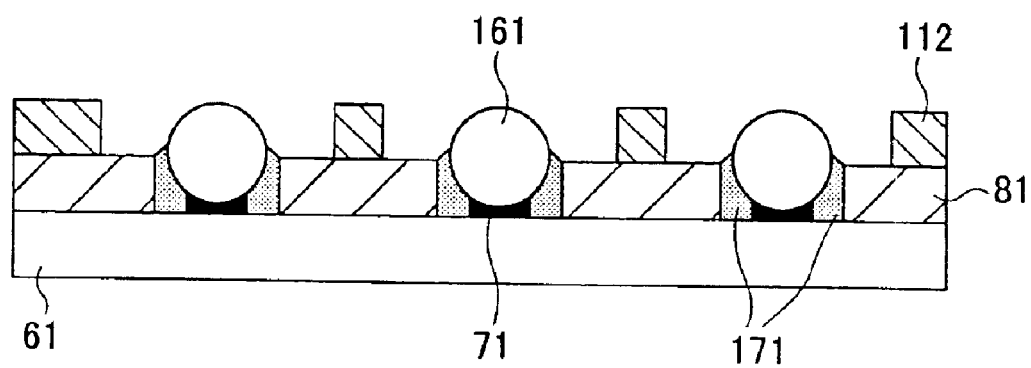
FIG. 19 is an illustrative drawing showing a fourth step of the method of forming solder balls on the substrate according to the fourth embodiment of the present invention.

A heating process is then performed at the temperature T1 that is higher than the melting point T2 of solder of the solder paste 90, and that is also higher than the curing temperature T3 of the thermosetting resin 171. Consequently, as shown in FIG. 19, the thermosetting resin 171 provides connections between the solder balls 161 and the sidewalls of the film-like solder resist 81. When this happens, the thermosetting resin 171 is arranged such as to cover part of the solder balls 161 up to a point higher than the upper surface of the film-like solder resist 81. The temperature T1 of the heating process may be 240 degrees Celsius.

Figure 20:
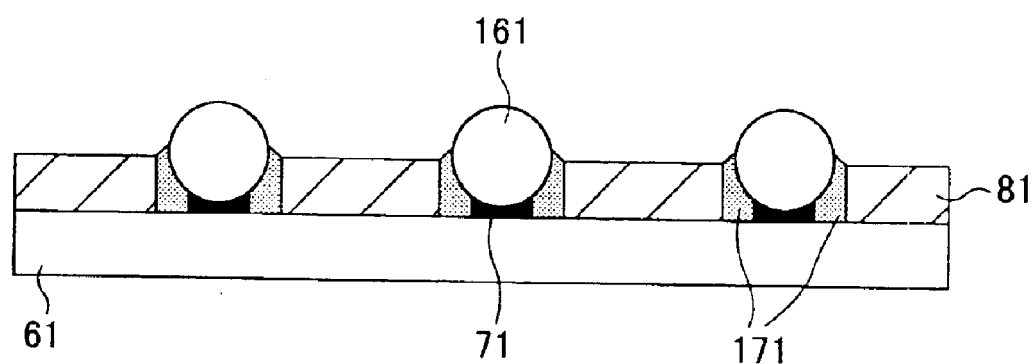
FIG. 20 is an illustrative drawing showing a fifth step of the method of forming solder balls on the substrate according to the fourth embodiment of the present invention.

As shown in FIG. 20, only the film-like photo-resist 112 is immersed in detachment liquid for the purpose of removing the film-like photoresist 112. When this is done, solder powder remaining on the surface of the film-like photoresist 112 is also removed.

It should be noted that it suffices to use any other method instead of the method of immersion into the detachment liquid as long as the film-like photo-resist 112 are properly removed. For example, removal by showering of detachment liquid, removal by application of ultrasonic wave to detachment liquid, and removal by use of a detachment-purpose tape are all viable options.

In the manner as described above, the film-like photo-resist 112 is placed on top of the film-like solder resist 81 to form the openings E larger than the openings B, thereby allowing a further increased amount of the solder paste 90 to fill the openings B and E. As a result, the thermosetting resin 171, provided as an underfill in an increased amount, is given such a form to cover part of the solder balls 161 up to a point higher than the upper surface of the film-like solder resist 81. This reinforces connection between the electrode pads 71 and the solder balls 161 and adherence between the film-like solder resist 81 and the semiconductor substrate 61.

The solder balls 161 are formed with increased size. Since the film-like photo-resist 112 is removed after the solder balls 161 are formed, solder powder that was attached to the film-like photo-resist 112 at the time of formation of the solder balls 161 can also be removed. This increases the reliability of connections in a circuit board assembly.

Fifth Embodiment

A fifth embodiment is directed to a variation of the third embodiment in which a metal mask has openings larger than the openings B formed in the film-like solder resist 81.

FIG. 21 through FIG. 24 are illustrative drawings showing the steps of forming solder balls on a substrate according to the fifth embodiment of the present invention.

Figure 21:
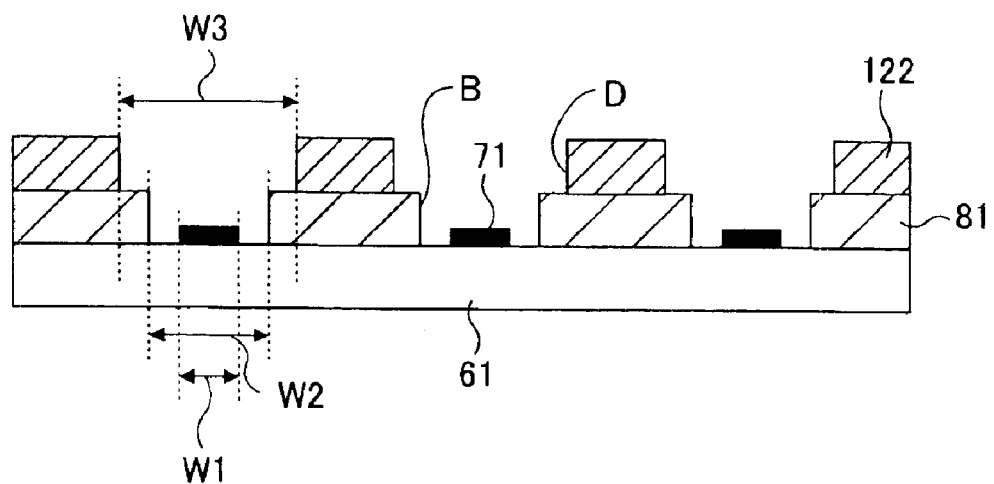
FIG. 21 is an illustrative drawing showing a first step of a method of forming solder balls on a substrate according to a fifth embodiment of the present invention.

First, patterns as shown in FIG. 2 and FIG. 3 are formed on the semiconductor substrate 61. Then, as shown in FIG. 21, a metal mask 122 having openings D is placed on the film-like solder resist 81 where a width W3>the width W2>the width W1 is satisfied.

Figure 22:
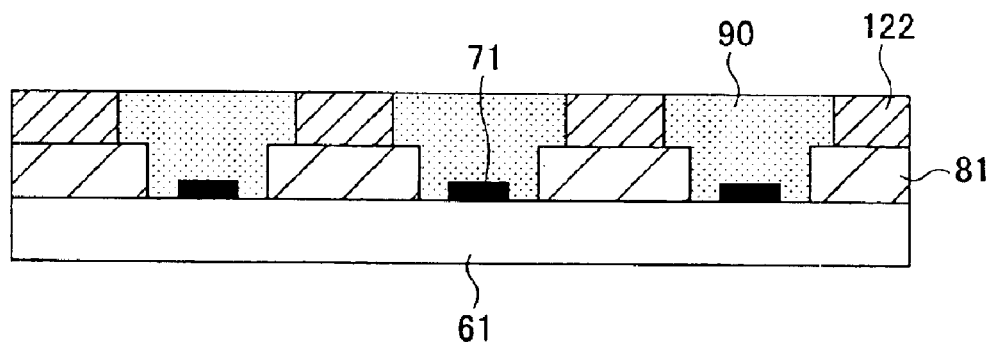
FIG. 22 is an illustrative drawing showing a second step of the method of forming solder balls on the substrate according to the fifth embodiment of the present invention.

As shown in FIG. 22, the solder paste 90, which is a mixture of solder and the thermosetting resin 171 having an underfilling property, is placed by a squeegee process to fill the openings B and D. Since the squeegee process is performed on a metal surface, the solder paste 90 slides well, which makes it possible to reduce the number of the squeegee processes that is necessary to fill the openings B and D with the solder paste 90. Sn-3% Ag may be used as solder. An epoxy-type resin may be used as the thermosetting resin 171. The openings B and D preferably have a circular shape, but may be any shape as long as the solder paste 90 can fill the openings B and D.

Figure 23:
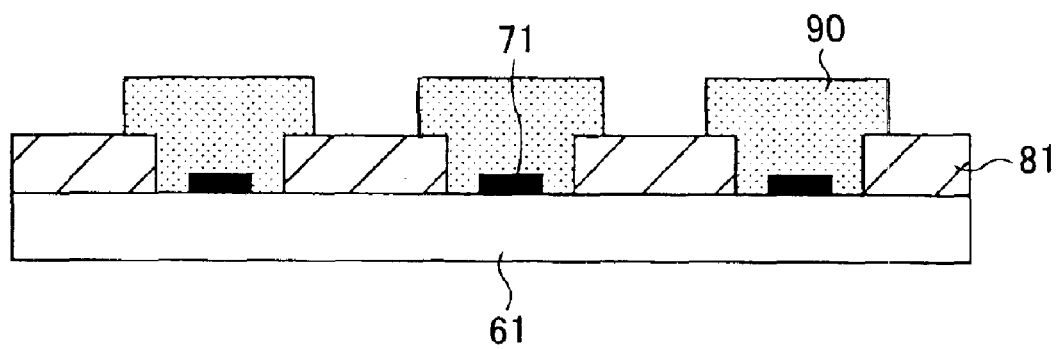
FIG. 23 is an illustrative drawing showing a third step of the method of forming solder balls on the substrate according to the fifth embodiment of the present invention.

As shown in FIG. 23, the metal mask 122 is removed from the film-like solder resist 81.

Figure 24:
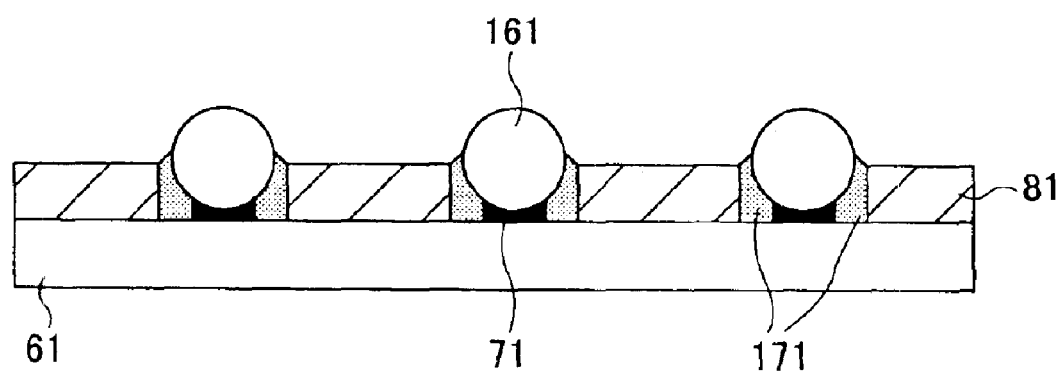
FIG. 24 is an illustrative drawing showing a fourth step of the method of forming solder balls on the substrate according to the fifth embodiment of the present invention.

A heating process is then performed at the temperature T1 that is higher than the melting point T2 of solder of the solder paste 90, and that is also higher than the curing temperature T3 of the thermosetting resin 171. Consequently, as shown in FIG. 24, the thermosetting resin 171 provides connections between the solder balls 161 and the sidewalls of the film-like solder resist 81. When this happens, the thermosetting resin 171 is arranged such as to cover part of the solder balls 161 up to a point higher than the upper surface of the film-like solder resist 81. The temperature T1 of the heating process may be 240 degrees Celsius.

In the manner as described above, the metal mask 122 is placed on top of the film-like solder resist 81 to form the two openings B and D, thereby allowing an increased amount of the solder paste 90 to fill the openings B and D. As a result, the thermosetting resin 171, provided as an underfill in an increased amount, is given such a form to cover part of the solder balls 161 up to a point higher than the upper surface of the film-like solder resist 81. This reinforces connection between the electrode pads 71 and the solder balls 161 and adherence between the film-like solder resist 81 and the semiconductor substrate 61.

The solder balls 161 are formed with increased size. Since the metal mask 122 is removed before the solder balls 161 are formed, solder powder that was attached to the metal mask 122 before the formation of the solder balls 161 can also be removed. This increases the reliability of connections in a circuit board assembly. Further, the metal mask 122 is not easy to break, so that it is easy to remove.

Sixth Embodiment

A sixth embodiment is directed to a variation of the second embodiment in which grooves are formed in the film-like solder resist 81 having the openings B formed therein.

FIG. 25 through FIG. 30 are illustrative drawings showing the steps of forming solder balls on a substrate according to the sixth embodiment of the present invention.

First, as shown in FIG. 2 which has already been described, the electrode pads 71 are patterned on the semiconductor substrate 61, and the film-like solder resist 81 is placed on the electrode pads 71.

Figure 25:
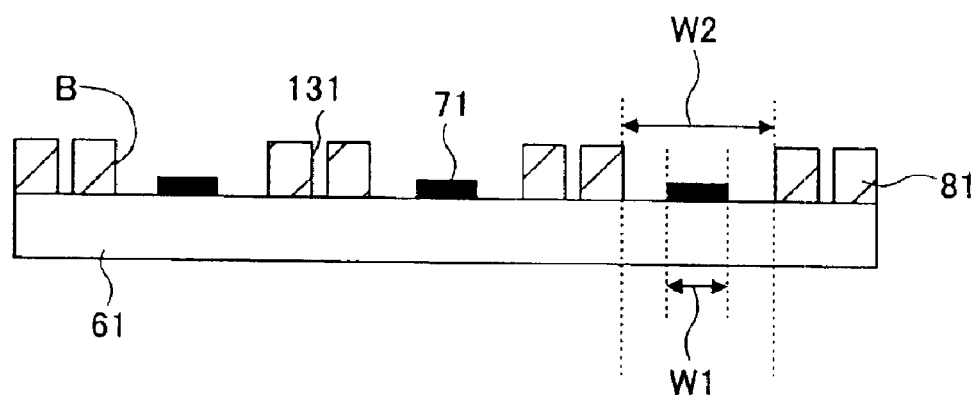
FIG. 25 is an illustrative drawing showing a first step of a method of forming solder balls on a substrate according to a sixth embodiment of the present invention.

As shown in FIG. 25, then, exposure and developing processes are performed to form the openings B and grooves 131 in the film-like solder resist 81 such that the width W2>the width W1 is satisfied. The width W2 of the openings B may be about 1.3 to 3.0 times as large as the width W1 of the electrode pads 71.

Figure 26:
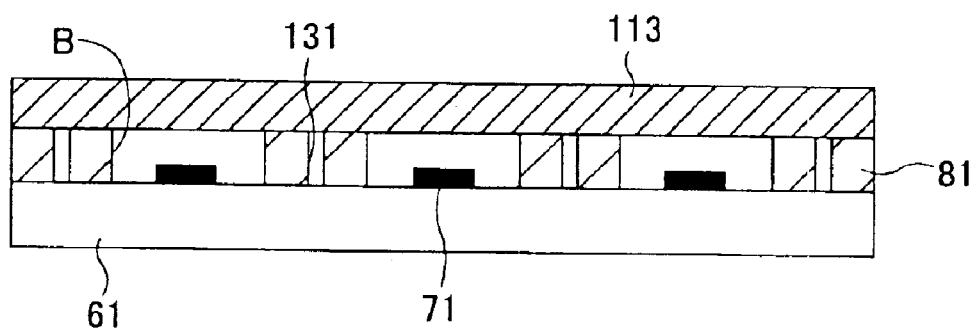
FIG. 26 is an illustrative drawing showing a second step of the method of forming solder balls on the substrate according to the sixth embodiment of the present invention.

As shown in FIG. 26, a film-like photo-resist 113 is placed on the film-like solder resist 81.

Figure 27:
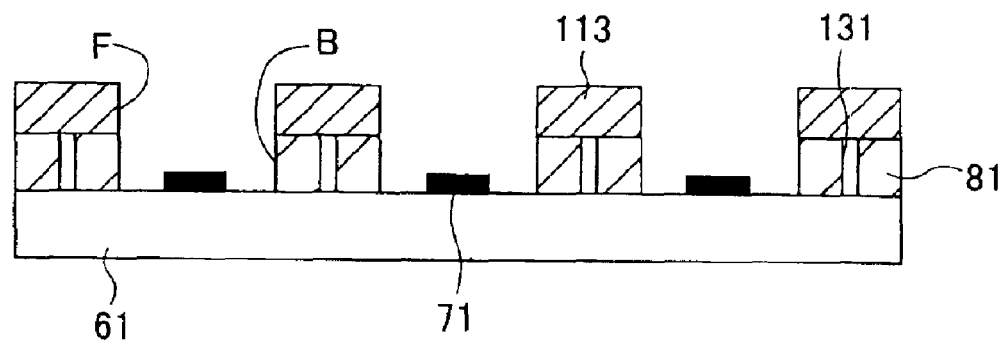
FIG. 27 is an illustrative drawing showing a third step of the method of forming solder balls on the substrate according to the sixth embodiment of the present invention.

As shown in FIG. 27, exposure and developing processes are performed to form openings F in the film-like photo-resist 113 such that the openings F have the same shape as the openings B.

Figure 28:
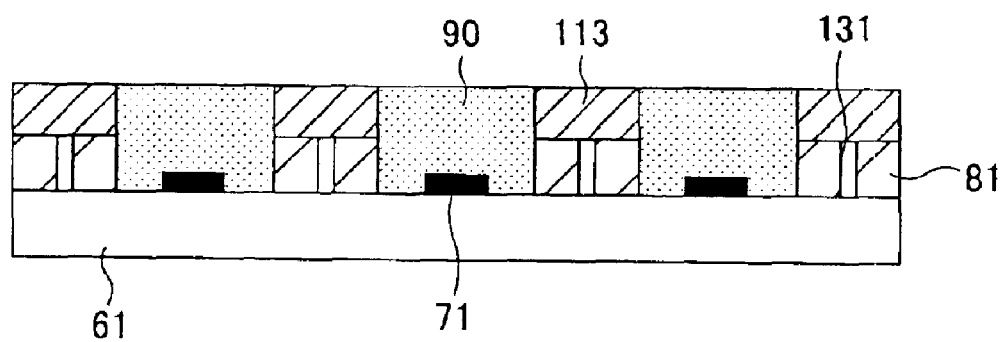
FIG. 28 is an illustrative drawing showing a fourth step of the method of forming solder balls on the substrate according to the sixth embodiment of the present invention.

As shown in FIG. 28, the solder paste 90, which is a mixture of solder and the thermosetting resin 171 having an underfilling property, is placed by a squeegee process to fill the openings B and F. The squeegee process may be performed 3 to 8 times to completely fill the openings B and F with the solder paste 90. Sn-3% Ag may be used as solder. An epoxy-type resin may be used as the thermosetting resin 171. The openings B and F preferably have a circular shape, but may be any shape as long as the solder paste 90 can fill the openings B and F.

Figure 29:
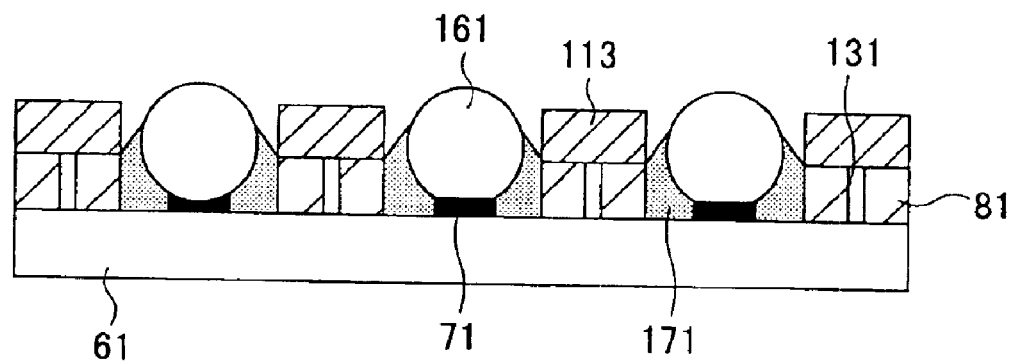
FIG. 29 is an illustrative drawing showing a fifth step of the method of forming solder balls on the substrate according to the sixth embodiment of the present invention.

A heating process is then performed at the temperature T1 that is higher than the melting point T2 of solder of the solder paste 90, and that is also higher than the curing temperature T3 of the thermosetting resin 171. Consequently, as shown in FIG. 29, the thermosetting resin 171 provides connections between the solder balls 161 and the sidewalls of the film-like solder resist 81. The temperature T1 of the heating process may be 240 degrees Celsius. When this is done, solder powder that was contained in the solder paste 90 may possibly remain on the surface of the film-like photo-resist 113. If assemblage is performed with the solder powder attached, adhesion with a circuit board may be compromised.

Figure 30:
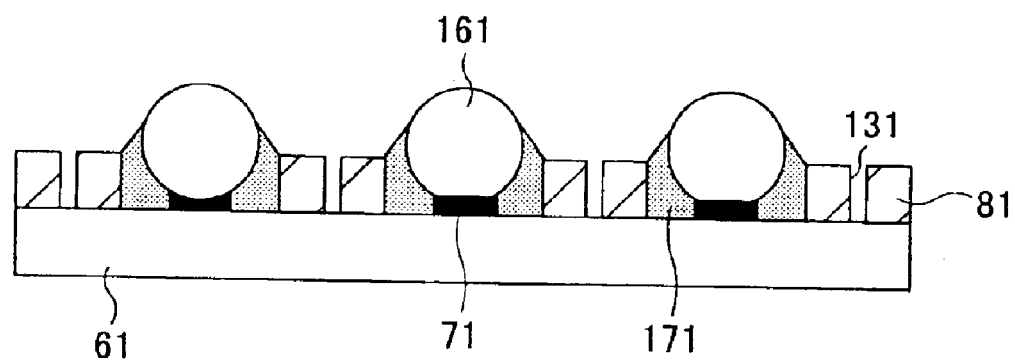
FIG. 30 is an illustrative drawing showing a sixth step of the method of forming solder balls on the substrate according to the sixth embodiment of the present invention.

As shown in FIG. 30, only the film-like photo-resist 113 is immersed in detachment liquid for the purpose of removing the film-like photoresist 113. When this is done, the solder powder remaining on the surface of the film-like photoresist 113 is also removed.

It should be noted that it suffices to use any other method instead of the method of immersion into the detachment liquid as long as the film-like photo-resist 113 are properly removed. For example, removal by showering of detachment liquid, removal by application of ultrasonic wave to detachment liquid, and removal by use of a detachment-purpose tape are all viable options.

In the manner as described above the solder balls are formed, with the thermosetting resin 171 provided as an underfill between the solder balls 161 and the film-like solder resist 81 on the semiconductor substrate 61. This reinforces connection between the electrode pads 71 and the solder balls 161 and adherence between the film-like solder resist 81 and the semiconductor substrate 61. Further, the grooves 131 formed in the film-like solder resist 81 prevents a short-circuit between adjacent solder balls.

Since the film-like photo-resist 113 is removed after the solder balls 161 are formed, solder powder that was attached to the film-like photo-resist 113 at the time of formation of the solder balls 161 can also be removed. This increases the reliability of connections in a circuit board assembly.

Seventh Embodiment

A seventh embodiment is directed to a variation of the third embodiment in which grooves are formed in the film-like solder resist 81 having the openings B formed therein.

FIG. 31 through FIG. 35 are illustrative drawings showing the steps of forming solder balls on a substrate according to the seventh embodiment of the present invention.

First, as shown in FIG. 2 which has already been described, the electrode pads 71 are patterned on the semiconductor substrate 61, and the film-like solder resist 81 is placed on the electrode pads 71.

Figure 31:
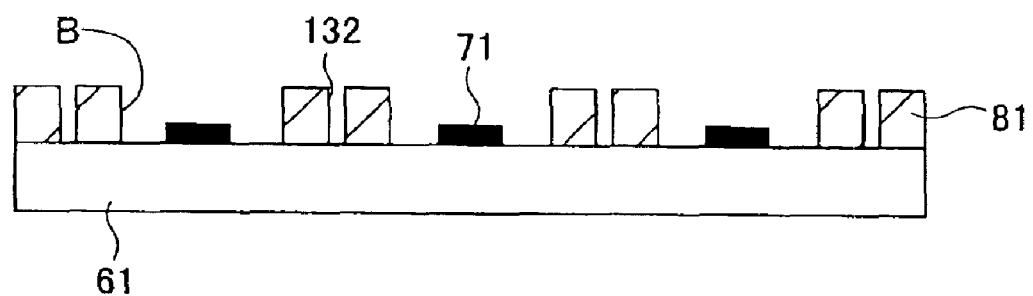
FIG. 31 is an illustrative drawing showing a first step of a method of forming solder balls on a substrate according to a seventh embodiment of the present invention.

As shown in FIG. 31, then, exposure and developing processes are performed to form the openings B and grooves 132 in the film-like solder resist 81 such that the width W2>the width W1 is satisfied. The width W2 of the openings B may be about 1.3 to 3.0 times as large as the width W1 of the electrode pads 71.

Figure 32:
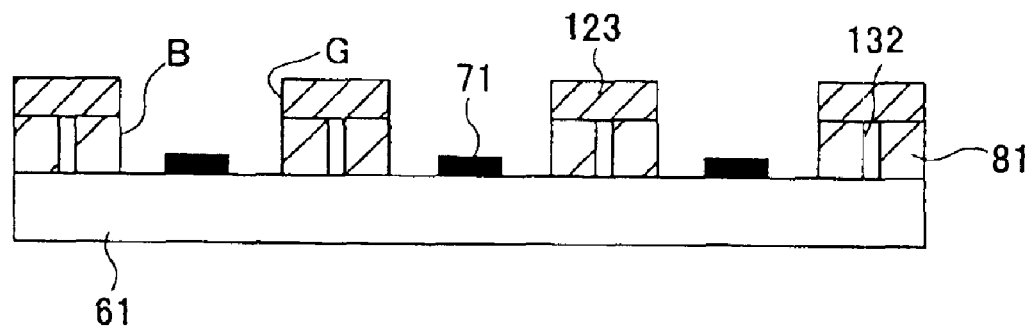
FIG. 32 is an illustrative drawing showing a second step of the method of forming solder balls on the substrate according to the seventh embodiment of the present invention.

As shown in FIG. 32, a metal mask 123 having openings G formed therein is placed on the film-like solder resist 81.

Figure 33:
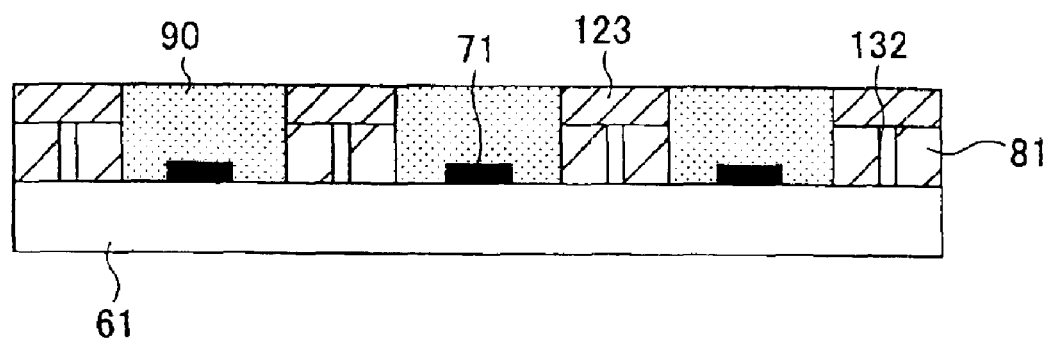
FIG. 33 is an illustrative drawing showing a third step of the method of forming solder balls on the substrate according to the seventh embodiment of the present invention.

As shown in FIG. 33, the solder paste 90, which is a mixture of solder and the thermosetting resin 171 having an underfilling property, is placed by a squeegee process to fill the openings B and G. The squeegee process may be performed 3 to 8 times to completely fill the openings B and G with the solder paste 90. Sn-3% Ag may be used as solder. An epoxy-type resin may be used as the thermosetting resin 171. The openings B and G preferably have a circular shape, but may be any shape as long as the solder paste 90 can fill the openings B and G.

Figure 34:
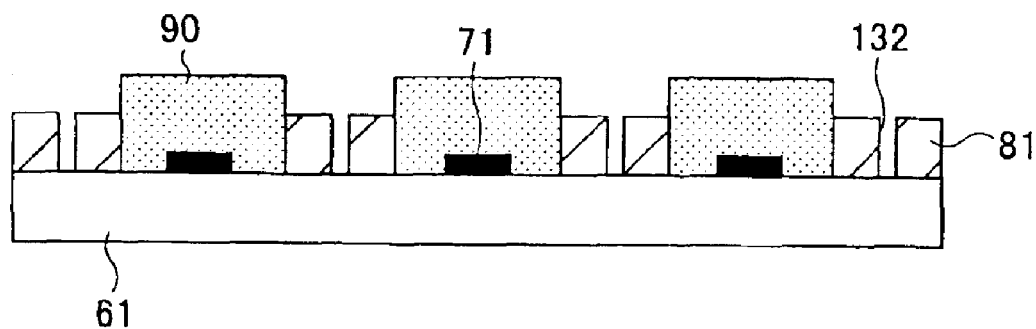
FIG. 34 is an illustrative drawing showing a fourth step of the method of forming solder balls on the substrate according to the seventh embodiment of the present invention.

As shown in FIG. 34, the metal mask 123 is removed from the film-like solder resist 81. A heating process is then performed at the temperature T1 that is higher than the melting point T2 of solder of the solder paste 90, and that is also higher than the curing temperature T3 of the thermosetting resin 171. The temperature T1 of the heating process may be 240 degrees Celsius.

Figure 35:
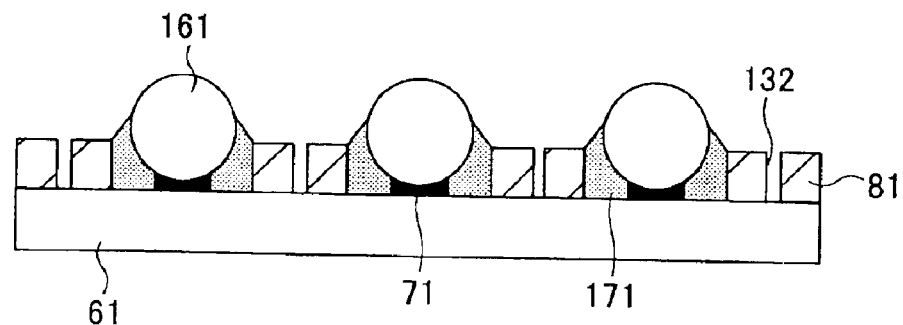
FIG. 35 is an illustrative drawing showing a fifth step of the method of forming solder balls on the substrate according to the seventh embodiment of the present invention.

Consequently, as shown in FIG. 35, the thermosetting resin 171 provides connections between the solder balls 161 and the sidewalls of the film-like solder resist 81.

In the manner as described above, the solder balls are formed, with the thermosetting resin 171 provided as an underfill between the solder balls 161 and the film-like solder resist 81 on the semiconductor substrate 61. This reinforces connection between the electrode pads 71 and the solder balls 161 and adherence between the film-like solder resist 81 and the semiconductor substrate 61. Further, the grooves 132 formed in the film-like solder resist 81 prevents a short-circuit between adjacent solder balls.

Since the film-like photo-resist 113 is removed after the solder balls 161 are formed, solder powder that was attached to the film-like photo-resist 113 at the time of formation of the solder balls 161 can also be removed. This increases the reliability of connections in a circuit board assembly.

Eighth Embodiment

In an eighth embodiment, the substrate having the solder balls formed as described in connection with the first through seventh embodiments is implemented on a circuit board in a flip-chip configuration.

Figure 36:
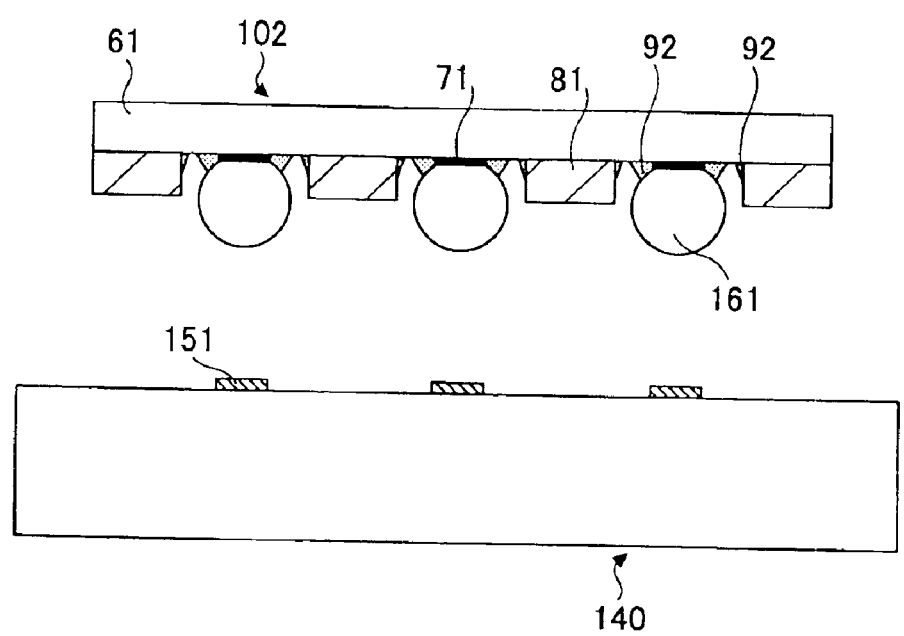
FIG. 36 is an illustrative drawing showing a first step of the method of assembling a flip-chip configuration when thermosetting resin is provided as an underfill in small amounts according to an eighth embodiment of the present invention.
Figure 37:
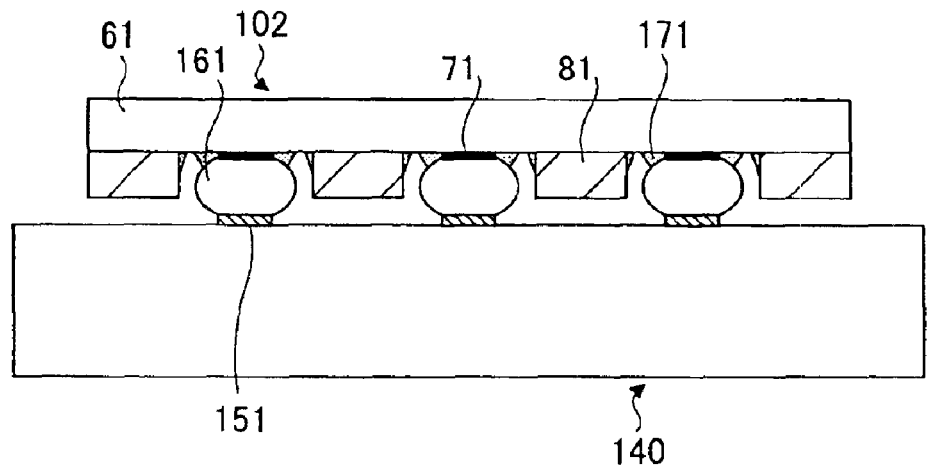
FIG. 37 is an illustrative drawing showing a second step of the method of assembling a flip-chip configuration when thermosetting resin is provided as an underfill in small amounts according to the eighth embodiment of the present invention.
Figure 38:
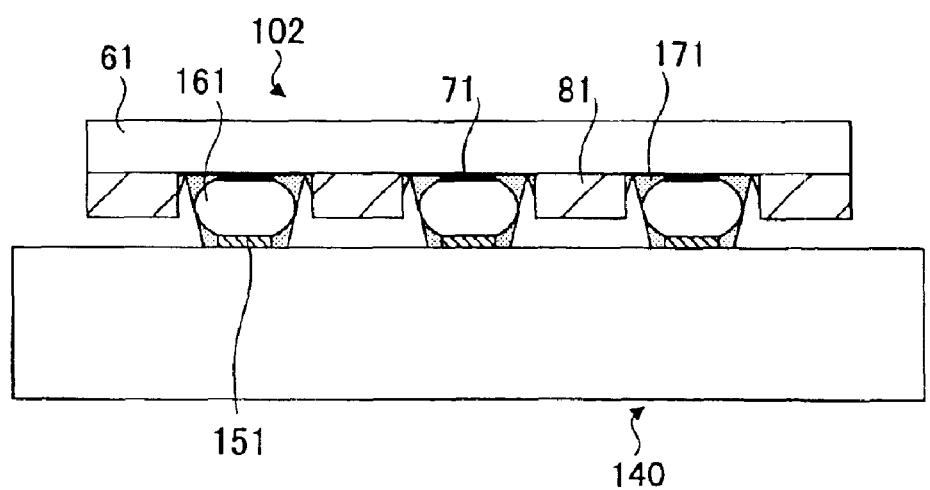
FIG. 38 is an illustrative drawing showing a third step of the method of assembling a flip-chip configuration when thermosetting resin is provided as an underfill in small amounts according to the eighth embodiment of the present invention.

FIG. 36 through FIG. 38 are illustrative drawings showing the steps of flip-chip assembly when the thermosetting resin serving as an underfill is provided in small amounts.

FIG. 36 shows a semiconductor chip 102 having solder balls formed thereon and an opposing circuit board having wiring layers formed thereon.

In the semiconductor chip 102, the solder balls 161 are formed on the electrode pads 71 that are placed on the semiconductor substrate 61, with the film-like solder resist 81 and the thermosetting resin 171 provided at their respective places. The thermosetting resin 171 is placed between the solder balls and the semiconductor substrate 61 as well as between the sidewalls of the film-like solder resist 81 and the semiconductor substrate 61.

A circuit board 140 has a multi-wiring-layer structure in which insulating layers (not shown) and wiring layers (not shown) are stacked one over the other. On the top of the circuit board 140, a wiring layer 151 is provided to receive the solder balls 161.

As shown in FIG. 37, the semiconductor chip 102 and the circuit board 140 are pressed together while heat is applied, thereby being assembled in a flip-chip configuration. When this is done, the thermosetting resin 171 melts, resulting in part of the thermosetting resin 171 covering the wiring layer 151 and part of the solder balls 161 as shown in FIG. 38. In this position, the thermosetting resin 171 is cured.

In this manner, the thermosetting resin 171 is placed between the semiconductor chip 102 and the circuit board 140, thereby reinforcing connections between the solder balls 161 and the wiring layer 151.

In the following, a description will be given of a case in which a substrate having a large amount of thermosetting resin 171 is assembled in a flip-chip configuration.

Figure 39:
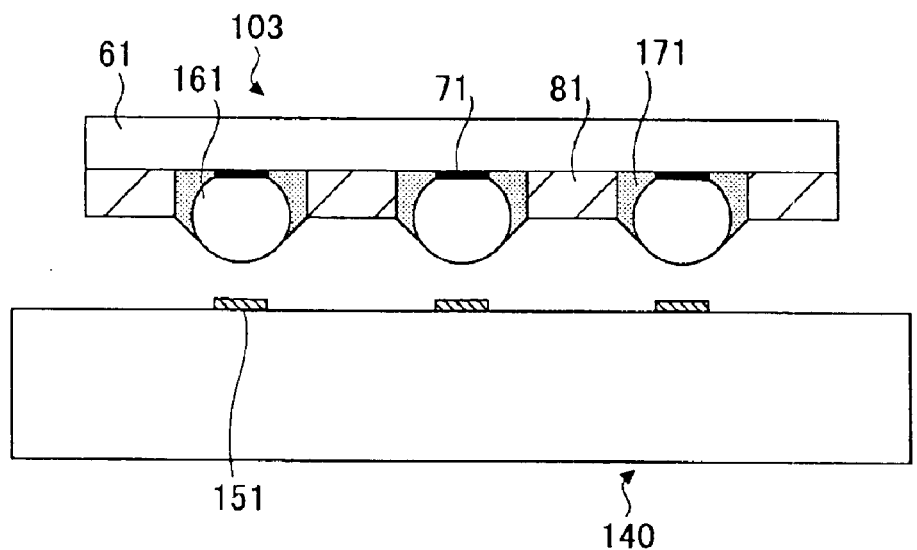
FIG. 39 is an illustrative drawing showing a first step of the method of assembling a flip-chip configuration when thermosetting resin is provided as an underfill in large amounts according to the eighth embodiment of the present invention.
Figure 40:
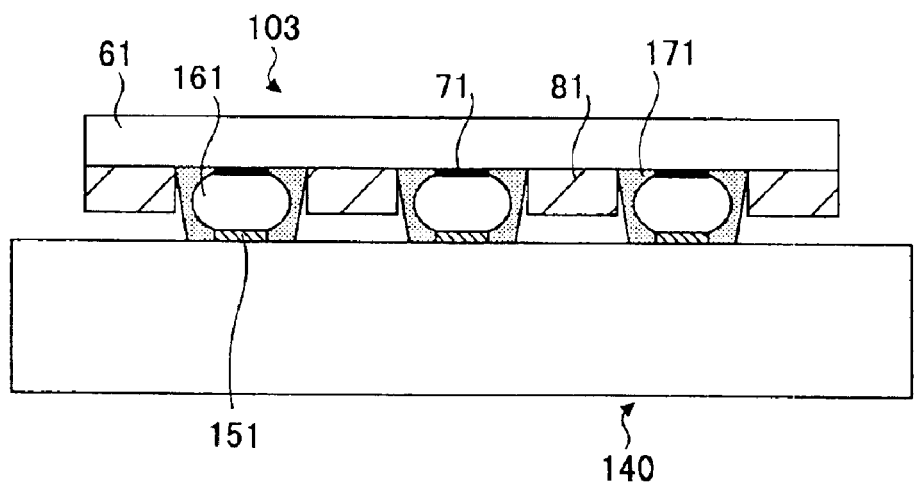
FIG. 40 is an illustrative drawing showing a second step of the method of assembling a flip-chip configuration when thermosetting resin is provided as an underfill in large amounts according to the eighth embodiment of the present invention.

FIG. 39 and FIG. 40 are illustrative drawings showing the steps of flip-chip assembly when the thermosetting resin serving as an underfill is provided in large amounts according to the eighth embodiment of the present invention.

FIG. 39 shows a semiconductor chip 103 having the solder balls 161 formed thereon and the opposing circuit board 140 having the wiring layers 151 formed thereon.

From the positions shown in FIG. 39, the semiconductor chip 103 and the circuit board 140 are pressed together while heat is applied, thereby being assembled in a flip-chip configuration. When this is done, the thermosetting resin 171 melts, resulting in part of the thermosetting resin 171 covering the wiring layer 151 and the entirety of the solder balls 161 as shown in FIG. 40. In this position, the thermosetting resin 171 is cured.

In this manner, the thermosetting resin 171 is arranged to cover the solder balls 161, the electrode pads 71, and the wiring layer 151 completely without any exposed part. This reduces heat-induced deformation between the semiconductor chip 103 and the circuit board 140, thereby improving the reliability of connections.

Ninth Embodiment

Figure 41:
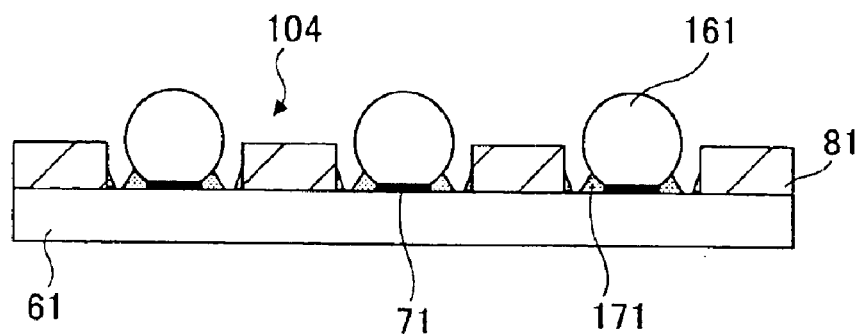
FIG. 41 is an illustrative drawing showing a first step of the method of assembling a flip-chip configuration according to a ninth embodiment of the present invention.
Figure 42:
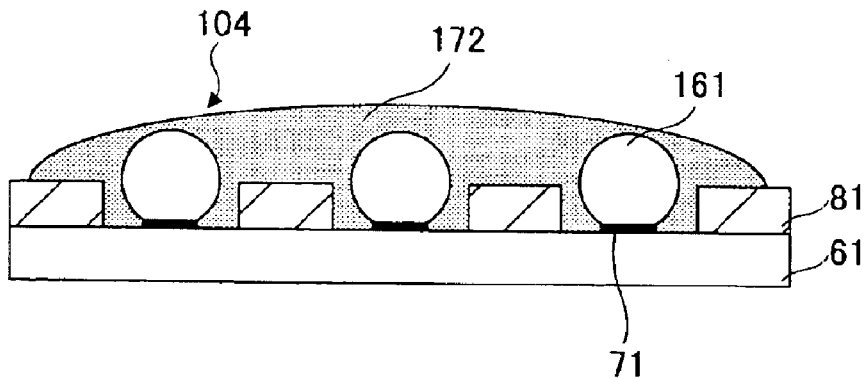
FIG. 42 is an illustrative drawing showing a second step of the method of assembling a flip-chip configuration according to the ninth embodiment of the present invention.
Figure 43:
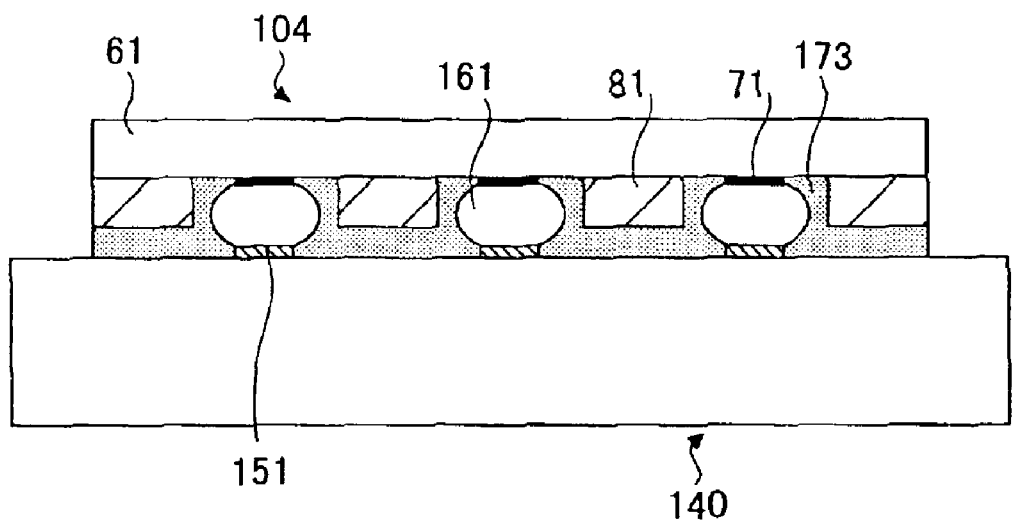
FIG. 43 is an illustrative drawing showing a third step of the method of assembling a flip-chip configuration according to the ninth embodiment of the present invention.

FIG. 41 through FIG. 43 are illustrative drawing showing the steps of flip-chip assembly according to a ninth embodiment of the present invention.

As shown in FIG. 41, a semiconductor chip 104 has the solder balls 161 formed on the electrode pads 71 that are placed on the semiconductor substrate 61, with the film-like solder resist 81 and the thermosetting resin 171 provided at their respective places.

On the semiconductor chip 104, a thermosetting resin 172 is placed as shown in FIG. 42.

The semiconductor chip 104 and the circuit board 140 are then pressed together while heat is applied. This results in a flip-chip configuration, which has a thermosetting resin member 173 completely filling the gap between the semiconductor chip 104 and the circuit board 140 as shown in FIG. 43. The thermosetting resin member 173 is made of the thermosetting resin 171 and the thermosetting resin 172.

The semiconductor chip 104 may be any one of the substrate with the solder balls formed on it as described in connection with the first through seventh embodiments.

In this manner, the thermosetting resin 172 is placed on the semiconductor chip 104 before flip-chip assembly is performed, so that the thermosetting resin 171 and the thermosetting resin 172 completely fill the gap between the semiconductor chip 104 and the circuit board 140. This reduces heat-induced deformation between the semiconductor chip 104 and the circuit board 140, and prevents the generation of voids, thereby improving the reliability of connections. Since the gap between the semiconductor chip 104 and the circuit board 140 is filled with the thermosetting resin 171 and the thermosetting resin 172, corrosion of the solder balls 161, the thermosetting resin 171, and etc., caused by moisture incursion is prevented. Further, migration or the like is avoided.

Tenth Embodiment

FIG. 44 through FIG. 47 are illustrative drawings showing the steps of flip-chip assembly according to a tenth embodiment of the present invention.

Figure 44:
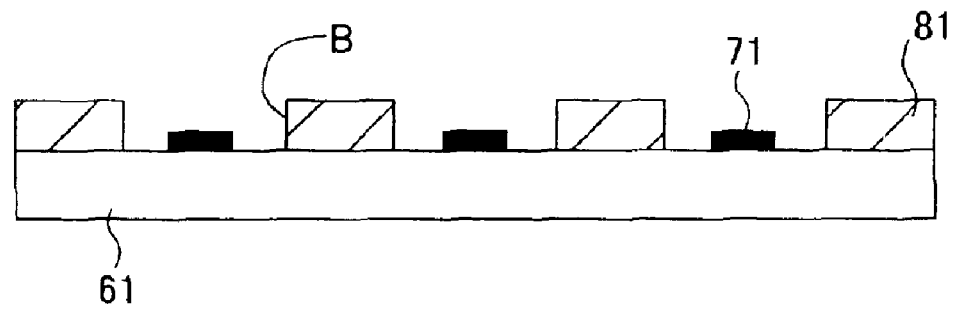
FIG. 44 is an illustrative drawing showing a first step of the method of assembling a flip-chip configuration according to a tenth embodiment of the present invention.

First, as shown in FIG. 44, the electrode pads 71 and the film-like solder resist 81 having the openings B are formed on the semiconductor substrate 61.

Figure 45:
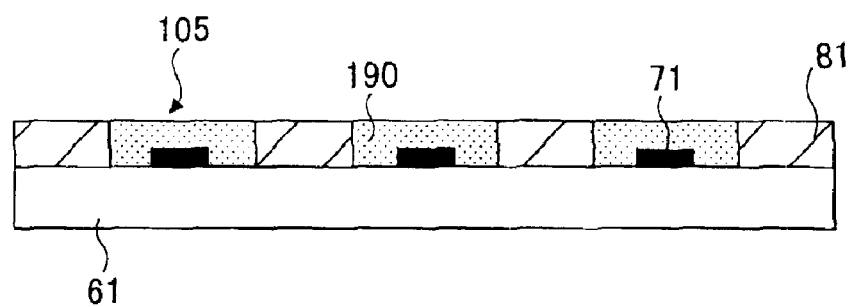
FIG. 45 is an illustrative drawing showing a second step of the method of assembling a flip-chip configuration according to the tenth embodiment of the present invention.

Then, as shown in FIG. 45, solder paste 190, which is a mixture of solder and thermosetting resin having an underfill property and a flux property, is placed to fill the openings B.

Figure 46:
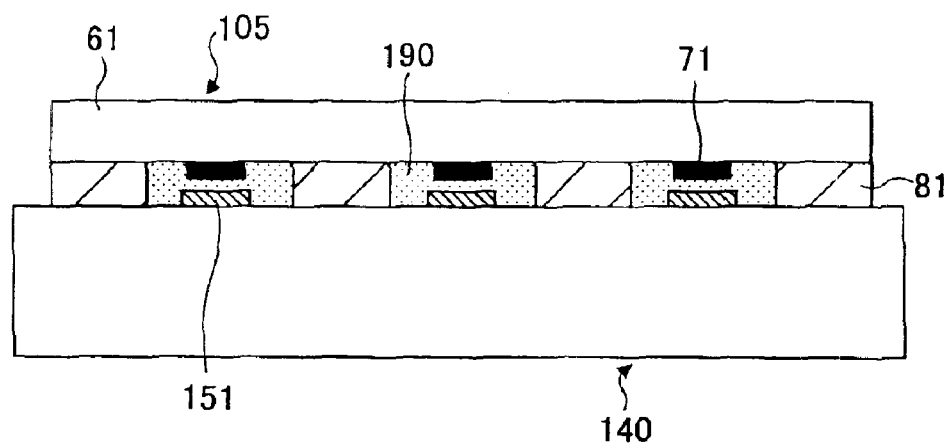
FIG. 46 is an illustrative drawing showing a third step of the method of assembling a flip-chip configuration according to the tenth embodiment of the present invention.

As shown in FIG. 46, the surface of a semiconductor chip 105 on which the electrode pads 71 are formed is positioned to face the surface of the circuit board 140 on which the wiring layer 151 is formed, and the solder paste 190 is brought in contact with the wiring layer 151.

Figure 47:
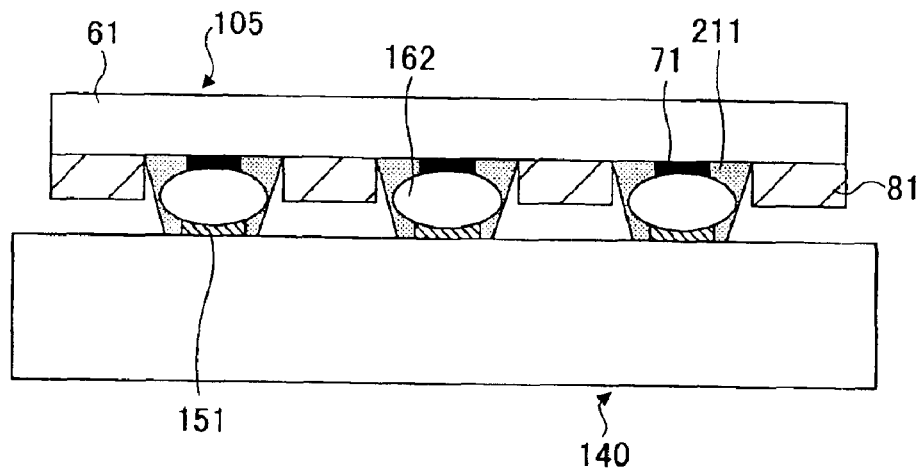
FIG. 47 is an illustrative drawing showing a fourth step of the method of assembling a flip-chip configuration according to the tenth embodiment of the present invention.

A heating process is then performed to form solder balls 162 between the electrode pads 71 and the wiring layer 151 as shown in FIG. 47, with a cured thermosetting resin member 211 covering the electrode pads 71, the wiring layer 151, and the solder balls 162 between the semiconductor substrate 61 and the circuit board 140 in a flip-chip configuration. The temperature of the heating process may be set to 230 degrees Celsius in order to form the structure described above.

This flip-chip assembly makes it possible to perform the formation of the solder balls 162, the placement of the thermosetting resin member 211, and the assemblage of the semiconductor substrate 61 and the circuit board 140 all through a single heating process. Manufacturing steps can thus be simplified, resulting in cost reduction.

Eleventh Embodiment

An eleventh embodiment is a variation of the tenth embodiment.

Figure 48:
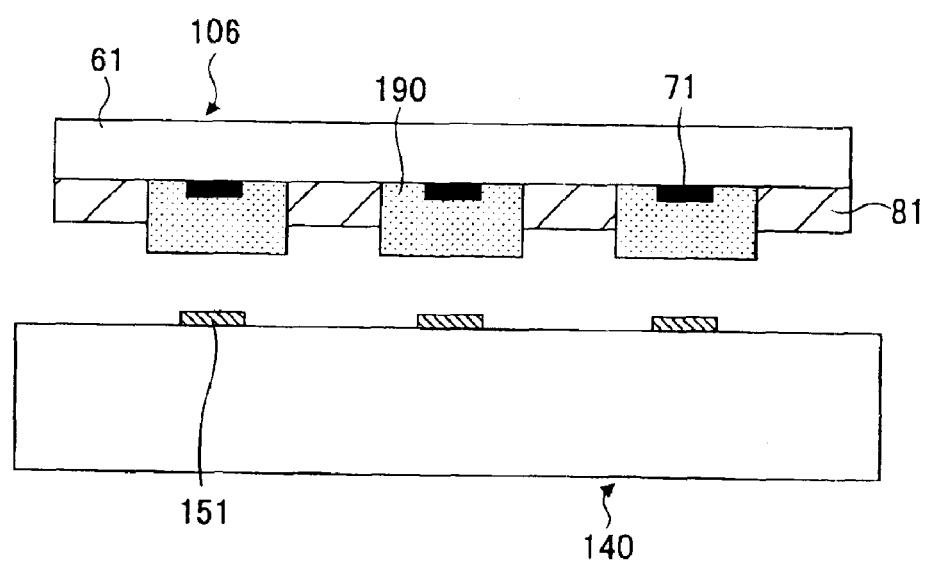
FIG. 48 is an illustrative drawing showing a first step of the method of assembling a flip-chip configuration according to an eleventh embodiment of the present invention.
Figure 49:
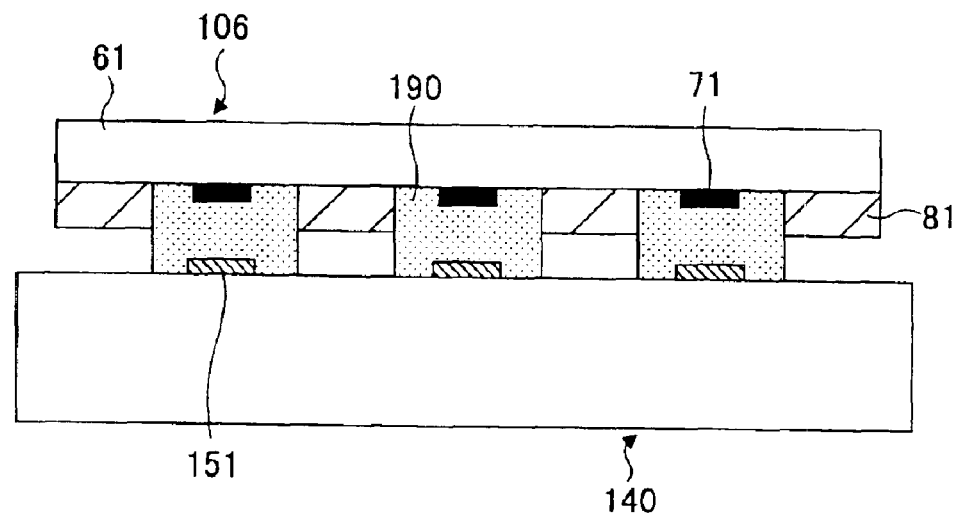
FIG. 49 is an illustrative drawing showing a second step of the method of assembling a flip-chip configuration according to the eleventh embodiment of the present invention.
Figure 50:
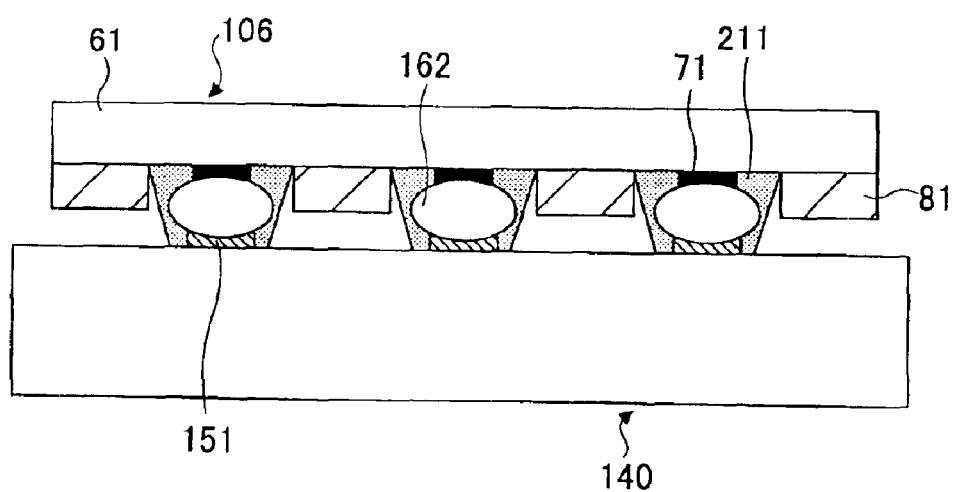
FIG. 50 is an illustrative drawing showing a third step of the method of assembling a flip-chip configuration according to the eleventh embodiment of the present invention.

FIG. 48 through FIG. 50 are illustrative drawings showing the steps of flip-chip assembly according to the eleventh embodiment of the present invention.

A semiconductor chip 106 shown in FIG. 48 has a structure in which the solder paste 190 is provided to fill the openings B and C such as those shown in FIG. 8, with the film-like photo-resist 111 having already been removed.

As shown in FIG. 49, the surface of the semiconductor chip 106 on which the electrode pads 71 are formed is positioned to face the surface of the circuit board 140 on which the wiring layer 151 is formed, and the solder paste 190 is brought in contact with the wiring layer 151.

A heating process is then performed to form the solder balls 162 between the electrode pads 71 and the wiring layer 151 as shown in FIG. 50, with the cured thermosetting resin member 211 serving as an underfill and covering the electrode pads 71, the wiring layer 151, and the solder balls 162 between the semiconductor substrate 61 and the circuit board 140 in a flip-chip configuration. The temperature of the heating process may be set to 230 degrees Celsius in order to form the structure described above.

Here, the semiconductor chip 106 may have any one of the structures as shown in FIG. 12, FIG. 27, and FIG. 32.

This flip-chip assembly makes it possible to perform the formation of the solder balls 162, the placement of the thermosetting resin member 211, and the assemblage of the semiconductor substrate 61 and the circuit board 140 all through a single heating process. Manufacturing steps can thus be simplified. Since the solder paste 190 fills the two openings, an increased amount of the solder paste 190 is provided on the semiconductor substrate 61. This increases the size of the solder balls 162. Since the amount of the underfill of the thermosetting resin member 211 also increases, strong reinforcement can be provided for the electrode pads 71, the wiring layer 151, and the solder balls 162 between the semiconductor substrate 61 and the circuit board 140. This reduces heat-induced deformation between the semiconductor chip 106 and the circuit board 140, thereby improving the reliability of connections.

Twelfth Embodiment

Figure 51:
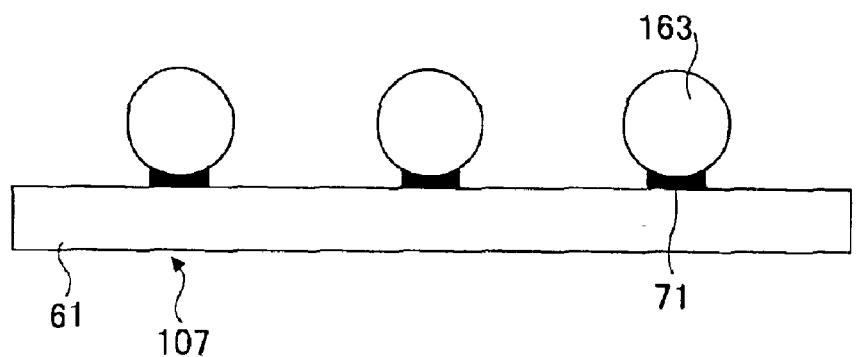
FIG. 51 is an illustrative drawing showing a first step of the method of assembling a flip-chip configuration according to a twelfth embodiment of the present invention.
Figure 52:
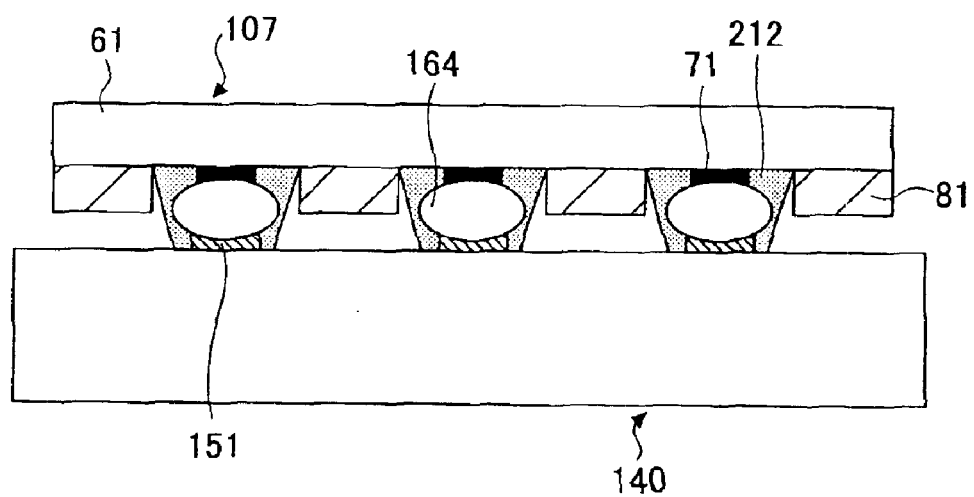
FIG. 52 is an illustrative drawing showing a second step of the method of assembling a flip-chip configuration according to the twelfth embodiment of the present invention.

FIG. 51 and FIG. 52 are illustrative drawings showing the steps of flip-chip assembly according to the eleventh embodiment of the present invention.

First, as shown in FIG. 51, the electrode pads 71 are patterned on the semiconductor substrate 61, and solder balls 163 are formed on the electrode pads 71. The solder balls 163 are made of solder paste that is a mixture of solder and thermosetting resin having an underfill property and a flux property.

A heating process is then performed after the solder balls 163 are brought in contact with the wiring layer 151. This forms solder balls 164. Also, a thermosetting resin member 212, which was contained in the solder balls 163, ends up covering the electrode pads 71, the wiring layer 151, and the solder balls 162 between the semiconductor substrate 61 and the circuit board 140. In this manner, a flip-chip configuration may be made by forming solder balls.

In the embodiments described above, the solder paste may include a flux having an activating property. The solder may be a Pb—Sn alloy having Sn as a main component, for example. The solder may include Sn as a main component, and further includes an element selected from a group consisting of Ag, Cu, Bi, In, Sb, and Au, for example.

Further, the present invention is not limited to these embodiments, but various variations and modifications may be made without departing from the scope of the present invention.

The present application is based on Japanese priority application No. 2002-265432 filed on Sep. 11, 2002, with the Japanese Patent Office, the entire contents of which are hereby incorporated by reference.

What is claimed is:

1. A method of forming a solder bell, comprising the steps of:

forming an electrode pad on a substrate;

forming an insulating layer having a first opening to expose the electrode pad;

filling the first opening with solder paste that includes solder and first resin; and applying a heating process to the solder paste so as to form a solder ball on the electrode pad and to form a cured resin member of said first resin across a border between the electrode pad and the substrate and between the insulating layer and the substrate.

2. The method as claimed in claim 1, wherein the solder paste includes a flux having an activating property.

3. The method as claimed in claim 1, wherein the solder is a Pb—Sn alloy having Sn as a main component.

4. The method as claimed in claim 1, wherein the solder includes Sn as a main component, and includes an element selected from a group consisting of Ag, Cu, Bi, In, Sb, and Au.

5. The method as claimed in claim 1, wherein the first opening is larger than the electrode pad such that an edge of the first opening does not touch the electrode pad.

6. The method as claimed in claim 1, wherein the solder paste is provided by a squeegee process to fill the first opening.

7. The method as claimed in claim 1, wherein temperature T1 of the heating process, melting point T2 of the solder, and curing temperature T3 of the first resin are related as: $T1 \geq T3 \geq T2$.

8. The method as claimed in claim 1, further comprising the steps of:

forming a detachment layer on the insulating layer;

forming a second opening in the detachment layer such that the second opening has an identical shape to the first opening;

filling the second opening as well as the first opening with the solder paste; and removing the detachment layer.

9. The method as claimed in claim 8, wherein said step of removing the detachment layer is performed by a method selected from a group consisting of removal by immersion in detachment liquid, removal by showering of detachment liquid, removal by applying ultrasonic wave to detachment liquid, and removal by use of detachment-purpose tape.

10. The method as claimed in claim 8, wherein the detachment layer is one of a resist film and a metal film.

11. The method as claimed in claim 1, further comprising the steps of:

forming a detachment layer on the insulating layer;

forming a second opening in the detachment layer such that the second opening is larger than the first opening;

filling the second opening as well as the first opening with the solder paste; and removing the detachment layer.

12. The method as claimed in claim 1, wherein the solder paste includes the first resin at an amount of 8 to 25 wt %.

* * * * *